(12) United States Patent
Kanaya

(10) Patent No.: US 7,750,383 B2
(45) Date of Patent: Jul. 6, 2010

(54) SEMICONDUCTOR APPARATUS AND METHOD FOR MANUFACTURING THE SEMICONDUCTOR APPARATUS

(75) Inventor: Hiroyuki Kanaya, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 236 days.

(21) Appl. No.: 11/858,361

(22) Filed: Sep. 20, 2007

(65) Prior Publication Data

US 2008/0073681 A1    Mar. 27, 2008

(30) Foreign Application Priority Data

Sep. 21, 2006    (JP) .......................... P2006-256262

(51) Int. Cl.
*H01L 27/108* (2006.01)

(52) U.S. Cl. ........................ 257/295; 257/296; 257/306; 257/E27.084; 257/E27.104

(58) Field of Classification Search ......... 257/295–297, 257/E21.664, 306, E27.084, E27.104
See application file for complete search history.

(56) References Cited

U.S. PATENT DOCUMENTS 6,440,815 B1    8/2002  Mitsuhashi

| | | | | |
|---|---|---|---|---|
| 6,603,161 B2 * | 8/2003 | Kanaya et al. | ............... | 257/295 |
| 6,611,014 B1 * | 8/2003 | Kanaya et al. | ............... | 257/295 |
| 6,897,501 B2 * | 5/2005 | Zhuang et al. | ............... | 257/295 |
| 6,924,156 B2 * | 8/2005 | Zhuang et al. | .................. | 438/3 |
| 7,029,925 B2 * | 4/2006 | Celii et al. | ..................... | 438/3 |
| 7,045,837 B2 * | 5/2006 | Egger et al. | ................. | 257/295 |
| 2006/0244023 A1 | 11/2006 | Kanaya | | |

FOREIGN PATENT DOCUMENTS

JP        2002-353414        12/2002

OTHER PUBLICATIONS

U.S. Appl. No. 12/110,601, filed Apr. 28, 2008, Kanaya.

* cited by examiner

*Primary Examiner*—Jerome Jackson, Jr.
*Assistant Examiner*—Yu Chen
(74) *Attorney, Agent, or Firm*—Oblon, Spivak, McClelland, Maier & Neustadt, L.L.P.

(57) ABSTRACT

According to an aspect of the present invention, there is provided a semiconductor apparatus including a semiconductor substrate, a transistor formed on the semiconductor substrate, an insulating film disposed on the semiconductor substrate, a ferroelectric capacitor and an upper mask. The ferroelectric capacitor includes a lower electrode disposed on the insulating film, a ferroelectric film disposed on the lower electrode and an upper electrode disposed on the ferroelectric film. The upper mask includes a hard mask disposed on the upper electrode and a sidewall mask disposed on at least part of a sidewall of the hard mask.

10 Claims, 24 Drawing Sheets

SEMICONDUCTOR APPARATUS AND METHOD FOR MANUFACTURING THE SEMICONDUCTOR APPARATUS

CROSS-REFERENCE TO RELATED APPLICATIONS

The entire disclosure of Japanese Patent Application No. 2006-256262 filed on Sep. 21, 2006 including specification, claims, drawings and abstract is incorporated herein by reference in its entirety.

BACKGROUND OF THE INVENTION

1. Field of the Invention

An aspect of the present invention relates to a semiconductor apparatus and a method for manufacturing the semiconductor apparatus, and more particularly to a semiconductor apparatus having a feature in a hard mask structure for forming a minute FeRAM capacitor structure and a method for manufacturing the semiconductor apparatus.

2. Description of the Related Art

With the advancement of the integration of ferroelectric memories (FeRAMs), it has become indispensable to form ferroelectric capacitors by performing Single-Mask Photo-Engraving Process (PEP) (hereunder sometimes referred to as a "1-Mask-1-PEP") to perform a collective patterning processing through a reactive ion etching (RIE) method. However, in such a ferroelectric capacitor (hereunder sometimes referred to as a "1-Mask-FeRAM"), a volatility of a ferroelectric capacitor material, particularly, a volatility of an electrode material formed by a noble metal such as platinum (Pt) or iridium (Ir) is remarkably poor and hard to etch. Additionally, in an etching of the ferroelectric capacitor material using a hard mask, the side wall portion is etched more greatly than the center portion. That is, a dropped portion (shoulder drop) on an upper sidewall portion (shoulder portion) of the hard mask is easily generated. Therefore, to form a 1-Mask FeRAM by the collective patterning processing through a reactive ion etching (RIE) method, the thick hard mask is required by taking into account the poor volatility of the electrode material and the an uniformity of the etching speed of the hard mask.

To process such the thick hard mask, the thick resist mask is also required. Therefore, a miniaturization of an FeRAM is prevented.

There have been disclosed a dielectric capacitor exhibiting an excellent electrical characteristic by preventing an entrance and diffusion of an external substance such as a reducing element for a dielectric film and a method for manufacturing the dielectric capacitor (for example, see JP-A-2002-353414 and U.S. Pat. No. 6,440,815).

The JP-A-2002-353414 and U.S. Pat. No. 6,440,815 disclose a method for manufacturing a dielectric capacitor in which a resist film is used as a mask to etch an oxide film and a first hydrogen diffusion preventing film, thereby forming an oxide film as a functional film, and the oxide film is used as an etching mask for forming a ferroelectric capacitor at a sequent step and the oxide film is used as a hard mask to process a ferroelectric film, a lower electrode and a contact film by a dry etching method.

SUMMARY OF THE INVENTION

According to an aspect of the present invention, there is provided a semiconductor apparatus including: a semiconductor substrate; a memory cell transistor including: a source diffusion layer disposed on the semiconductor substrate, a drain diffusion layer disposed on the semiconductor substrate, a gate insulating film disposed on the semiconductor substrate between the source diffusion layer and the drain diffusion layer, and a gate electrode disposed on the gate insulating film; an interlayer insulating film disposed on the semiconductor substrate and on the memory cell transistor; a ferroelectric capacitor including: a lower electrode disposed on the interlayer insulating film, a ferroelectric film disposed on the lower electrode, and an upper electrode disposed on the ferroelectric film; and an upper mask including: a hard mask disposed on the upper electrode, and a sidewall mask disposed on at least part of a sidewall of the hard mask.

According to another aspect of the present invention, there is provided a method for manufacturing a semiconductor apparatus including: forming a memory cell transistor that includes: a source diffusion layer disposed on a semiconductor substrate, a drain diffusion layer disposed on the semiconductor substrate, a gate insulating film disposed on the semiconductor substrate between the source diffusion layer and the drain diffusion layer, and a gate electrode disposed on the gate insulating film; depositing an interlayer insulating film on the semiconductor substrate; depositing a lower electrode layer on the interlayer insulating film; depositing a ferroelectric layer on the lower electrode layer; depositing an upper electrode layer on the ferroelectric layer; forming an upper mask that includes: a hard mask disposed on the upper electrode, and a sidewall mask disposed on at least part of a sidewall of the hard mask, by performing a forming process; and collectively processing the upper electrode layer, the ferroelectric layer and the lower electrode layer by performing an etching process.

BRIEF DESCRIPTION OF THE DRAWINGS

Embodiment may be described in detail with reference to the accompanying drawings, in which.

DETAILED DESCRIPTION OF THE INVENTION

Figure 1:
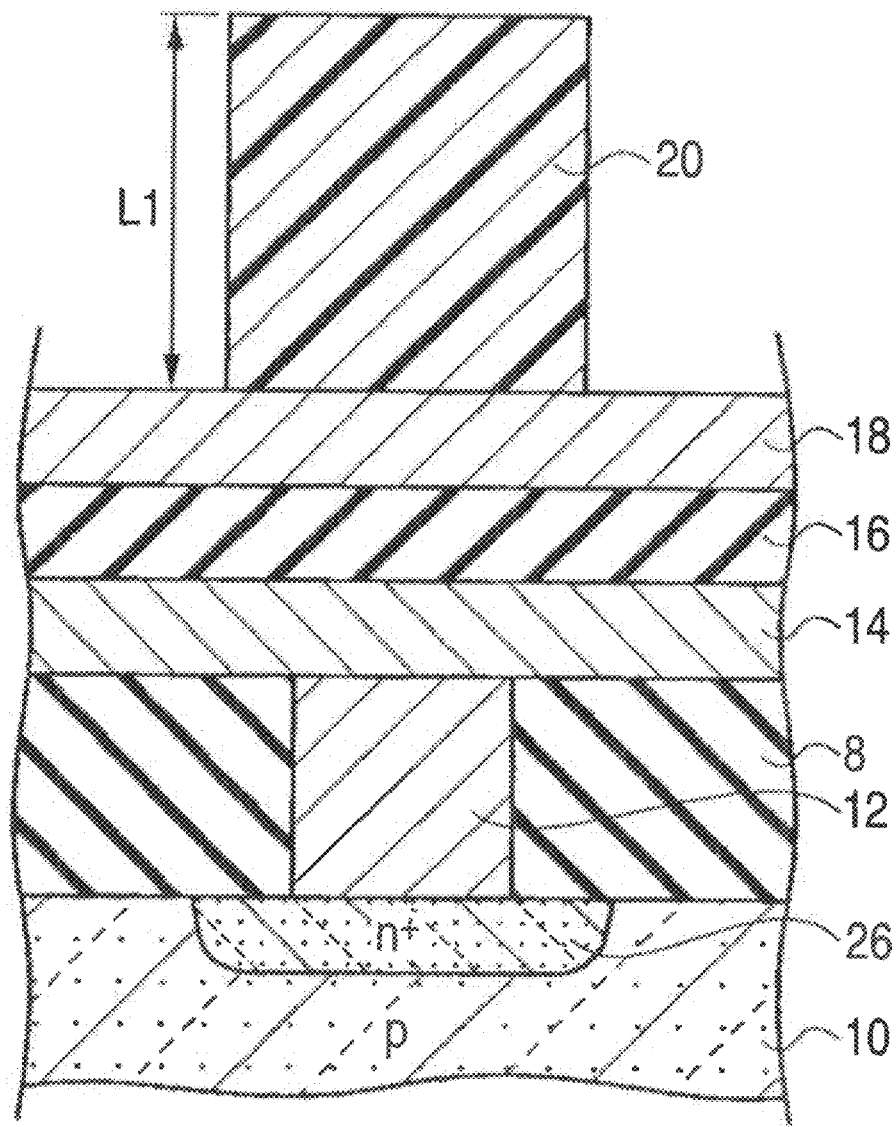
FIG. 1 is a typical sectional view showing a structure in one of steps of a method for manufacturing a semiconductor apparatus according to a first embodiment.

With reference to the drawings, next, first to fifth embodiments according to the invention will be described. In the following description of the drawings, the same or similar portions have the same or similar reference numerals. The drawings are typical and attention is to be paid to the fact that a relationship between a thickness and a planar dimension and a ratio of thicknesses of respective layers are different from real ones. Accordingly, specific thicknesses and dimensions are to be decided in consideration of the following description. Moreover, it is a matter of course that the respective drawings include portions having different relationships and ratios of mutual dimensions.

Furthermore, the following first to fifth embodiments will describe an apparatus and method for materializing the technical thought of the invention, and the technical thought of the invention does not restrict a material, a shape, a structure and an arrangement of a component to the following ones. The technical thought of the invention can be variously changed within the claims.

According to a semiconductor apparatus and a method for manufacturing the semiconductor apparatus in accordance with each of the embodiments, it is possible to form a minute FeRAM capacitor having a capacitor structure with a high taper angle even if the hard mask having a small thickness is used.

According to the semiconductor apparatus and the method for manufacturing the semiconductor apparatus in accordance with each of the embodiments, moreover, a sidewall mask is formed on a sidewall of a hard mask. The sidewall mask is formed by a material having a high etching-selectivity for a ferroelectric capacitor material. A ferroelectric capacitor is processed and formed by using the sidewall mask. Consequently, it is possible to decrease a ferroelectric capacitor area and to reduce an aspect ratio of a contact around the ferroelectric capacitor. That results a reduction of a memory cell size, an enhancement of a reliability, and reduction of a cost.

First Embodiment

FIGS. 1 to 6 show a typical sectional structure of steps in a method for manufacturing a semiconductor apparatus according to a first embodiment. Moreover, typical sectional structures of a memory cell portion and a peripheral circuit portion in the semiconductor apparatus according to the first embodiment are shown in FIGS. 7A and 7B, respectively.

(Device Structure)

Figure 7:
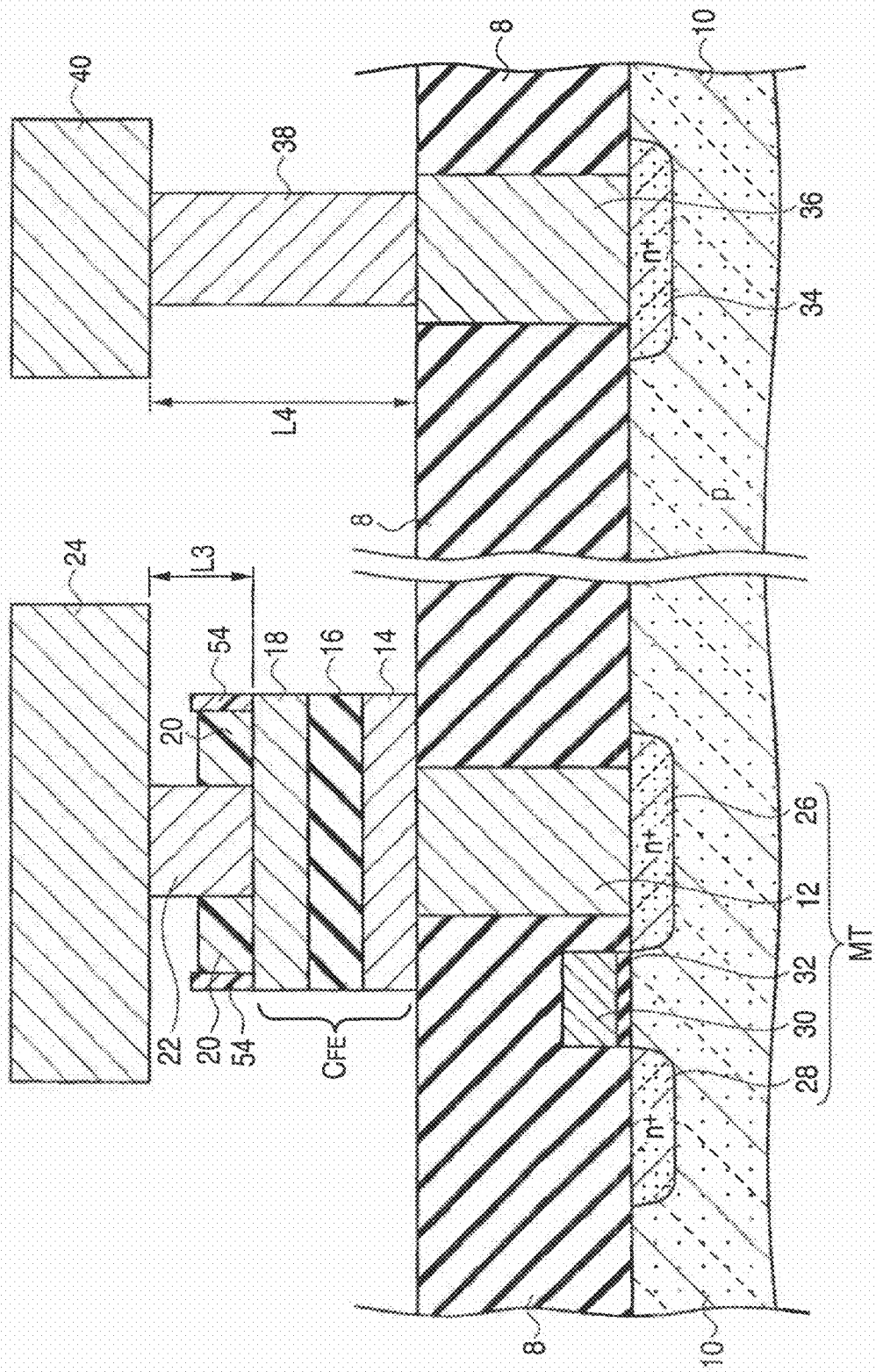
FIG. 7A is a typical sectional view showing a structure of a memory cell portion of a semiconductor apparatus according to the first embodiment.
FIG. 7B is a typical sectional view showing a structure of a peripheral circuit portion of a semiconductor apparatus according to the first embodiment.

As shown in FIG. 7A, the semiconductor apparatus according to the first embodiment includes, in a memory cell portion, a memory cell transistor MT having source-drain diffusion layers 26 and 28 disposed in a semiconductor substrate 10, a gate insulating film 32 disposed on the semiconductor substrate 10 between the source-drain diffusion layers 26 and 28, and a gate electrode 30 disposed on the gate insulating film 32, an interlayer insulating film 8 disposed on the semiconductor substrate 10, a ferroelectric capacitor $C_{FE}$ having a lower electrode 14 disposed on the interlayer insulating film 8, a ferroelectric film 16 disposed on the lower electrode 14, and an upper electrode 18 disposed on the ferroelectric film 16, a hard mask 20 disposed on the upper electrode 18, and a first sidewall mask 54 disposed on a sidewall of the hard mask 20. The hard mask 20 and the first sidewall mask 54 are functioning as an upper mask.

As shown in FIG. 7A, furthermore, the semiconductor apparatus according to the first embodiment includes, in the memory cell portion, a via hole electrode 22 disposed in a contact hole formed on the hard mask 20, and a wiring electrode 24 disposed on the via hole electrode 22.

As shown in FIG. 7A, the semiconductor apparatus according to the first embodiment further includes a plug electrode 12 disposed on the diffusion layer 26 in the source-drain diffusion layers 26 and 28 of the memory cell transistor MT, and the lower electrode 14 is connected to the plug electrode 12.

As shown in FIG. 7A, in the semiconductor apparatus according to the first embodiment, the lower electrode 14 of the ferroelectric capacitor $C_{FE}$ is connected to the source-drain diffusion layer 26 of the memory cell transistor MT. Therefore, the semiconductor apparatus according to the first embodiment can be applied to a TC unit series connection type FeRAM structure shown in FIGS. 21 and 22 or a 1T1C type FeRAM structure shown in FIG. 23 which will be described below, for example.

As shown in FIG. 7B, furthermore, the semiconductor apparatus according to the first embodiment includes, in a peripheral circuit portion, a contact diffusion layer 34 disposed in the semiconductor substrate 10, the interlayer insulating film 8 disposed on the semiconductor substrate 10, a via hole electrode 38 disposed on the interlayer insulating film 8, and a wiring electrode 40 disposed on the via hole electrode 38.

(Manufacturing Method)

As shown in FIGS. 1 to 6, the method for manufacturing the semiconductor apparatus according to the first embodiment includes the steps of forming the interlayer insulating film 8 on the semiconductor substrate 10, forming the ferroelectric capacitor $C_{FE}$ having the lower electrode 14 disposed on the interlayer insulating film 8, the ferroelectric film 16 disposed on the lower electrode 14 and the upper electrode 18 disposed on the ferroelectric film 16, forming the hard mask 20 on the upper electrode 18, and forming the first sidewall mask 54 on the sidewall of the hard mask 20, and the step of forming the ferroelectric capacitor $C_{FE}$ has the step of performing a collective processing by using the hard mask 20 and the first sidewall mask 54.

As shown in FIG. 7A, furthermore, the method for manufacturing the semiconductor apparatus according to the first embodiment includes the step of forming the memory cell transistor MT having the source-drain diffusion layers 26 and 28 disposed in the semiconductor substrate 10, the gate insulating film 32 disposed on the semiconductor substrate 10 between the source-drain diffusion layers 26 and 28, and the gate electrode 30 disposed on the gate insulating film 32.

As shown in FIG. 7A, moreover, the method for manufacturing the semiconductor apparatus according to the first embodiment includes the step of forming the contact hole on the hard mask 20, forming the via hole electrode 22 in the contact hole, and furthermore, forming the wiring electrode 24 on the via hole electrode 22 in the memory cell portion.

In addition, in the same manner as in FIG. 7A, the method for manufacturing the semiconductor apparatus according to the first embodiment includes the step of forming the plug electrode 12 on the diffusion layer 26 in the source-drain diffusion layers 26 and 28 of the memory cell transistor MT and forming the lower electrode 14 on the plug electrode 12.

In the same manner as in FIG. 7B, moreover, the method for manufacturing the semiconductor apparatus according to the first embodiment includes, in the peripheral circuit portion, the step of forming the contact diffusion layer 34 in the semiconductor substrate 10, forming a plug electrode 36 on the contact diffusion layer 34, forming the via hole electrode 38 on the plug electrode 36, and furthermore, forming the wiring electrode 40 on the via hole electrode 38.

With reference to the drawings, the manufacturing process will be described below in detail.

(a) First of all, as shown in FIG. 1, the hard mask 20 is formed on the upper electrode 18, for example, and an etching technique such as reactive ion etching (RIE) is used to process the hard mask 20. As a result, the hard mask 20 having a thickness L1 is obtained.

As a material of the hard mask 20, for example, it is possible to use at least one of an oxide film ($SiO_2$), an aluminum oxide film ($Al_xO_Y$), a zirconium oxide film ($ZrO_X$), a titanium oxide film ($TiO_X$), a titanium aluminum nitride film ($TiAl_xN_Y$), a titanium nitride film ($Ti_xN_Y$), a titanium aluminum nitride oxide film ($TiAl_xN_YO_Z$) and a titanium nitride oxide film ($Ti_xN_YO_Z$).

Figure 2:
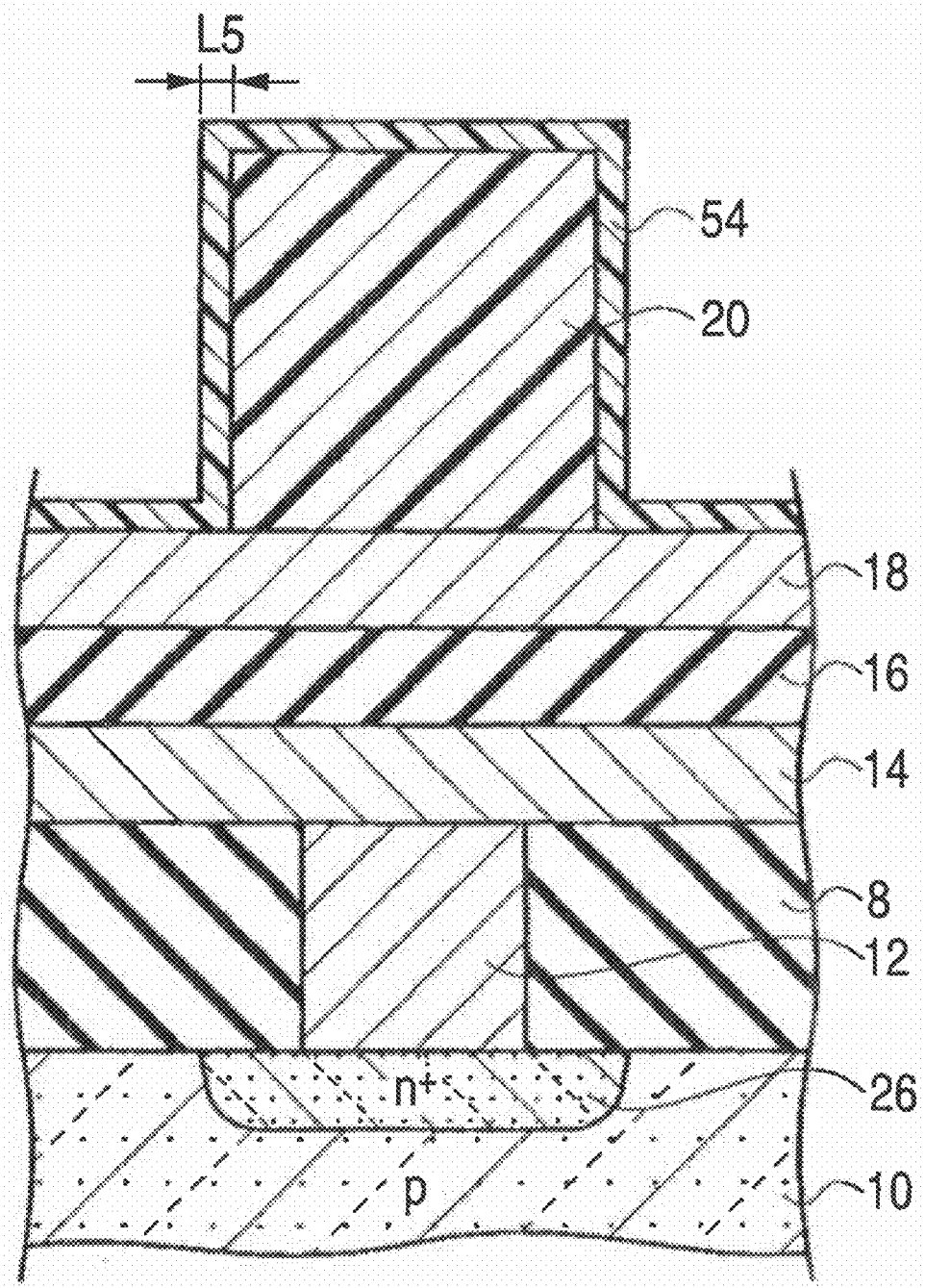
FIG. 2 is a typical sectional view showing a structure in one of steps of the method for manufacturing a semiconductor apparatus according to the first embodiment.

(b) As shown in FIG. 2, subsequently, the first sidewall mask 54 is deposited on a whole surface.

For a material of the first sidewall mask 54, it is preferable to use a material having a higher etching-selectivity than the hard mask 20.

As the material of the first sidewall mask 54, for example, it is possible to use at least one of an oxide film ($SiO_2$), an aluminum oxide film ($Al_xO_Y$), a zirconium oxide film ($ZrO_X$), a titanium oxide film ($TiO_X$), a titanium aluminum nitride film ($TiAl_xN_Y$), a titanium nitride film ($Ti_xN_Y$), a titanium aluminum nitride oxide film ($TiAl_xN_YO_Z$) and a titanium nitride oxide film ($Ti_xN_YO_Z$).

As a method for depositing the first sidewall mask 54, for example, it is possible to use an atomic layer deposition (ALD) method. In the case in which an aluminum oxide film ($Al_2O_3$) is used, for example, a deposited film has a thickness of approximately 20 nm.

Figure 4:
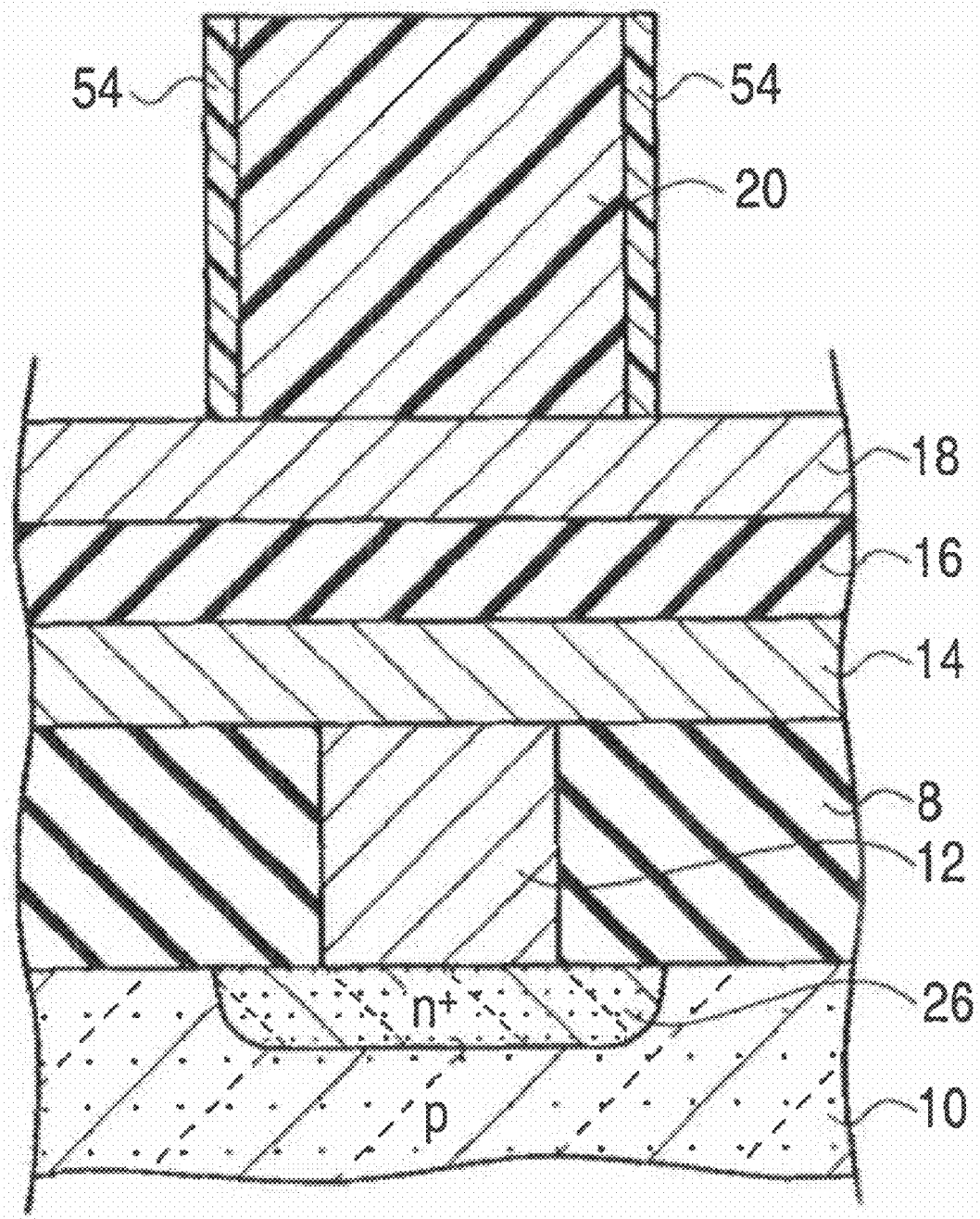
FIG. 4 is a typical sectional view showing a structure in one of steps of the method for manufacturing a semiconductor apparatus according to the first embodiment.

(c) As shown in FIG. 4, then, a whole surface is etched back to form the first sidewall mask 54 in the sidewall portion of the hard mask 20.

Figure 3:
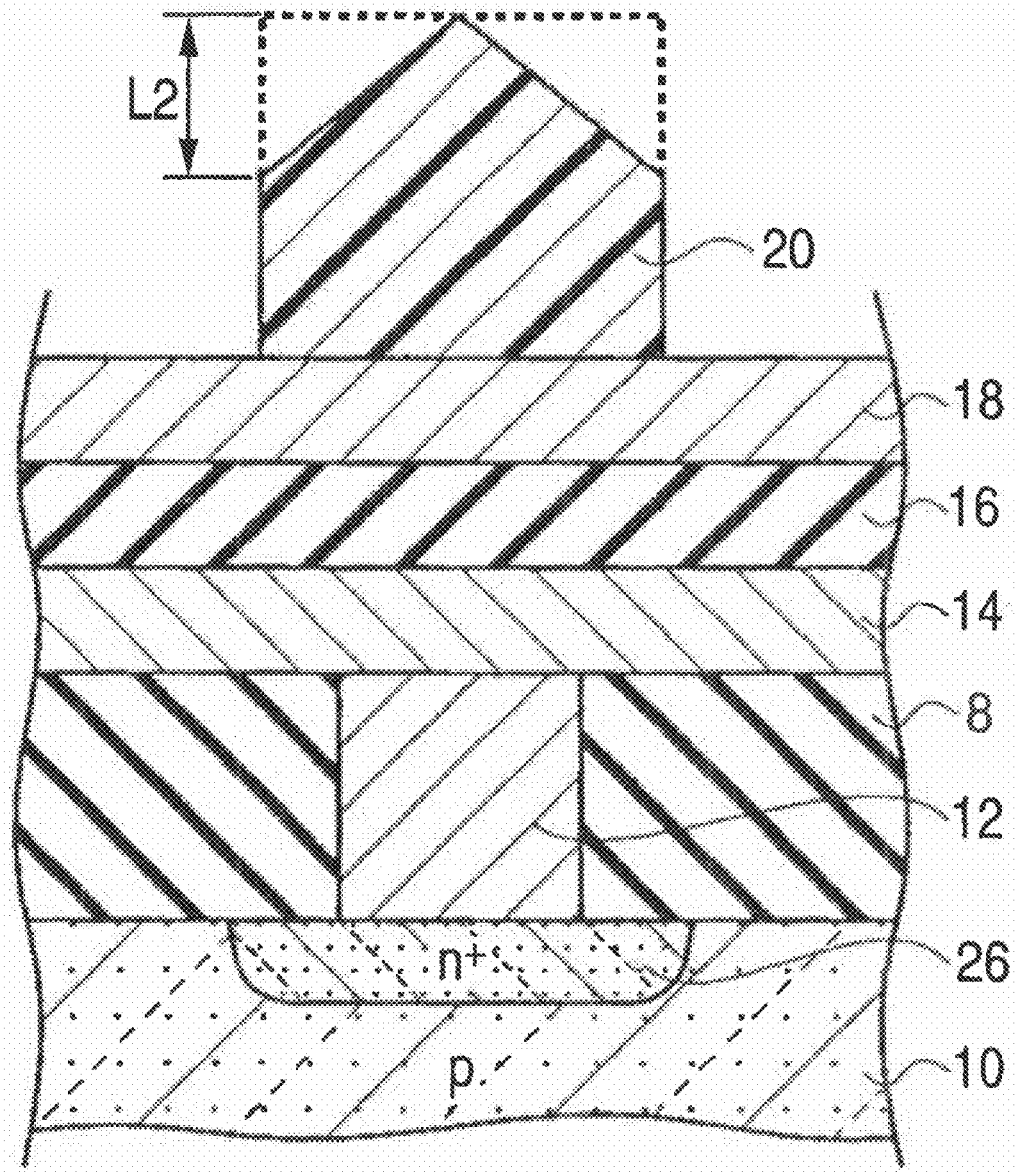
FIG. 3 is a typical sectional view showing a structure in one of steps of a method for manufacturing a semiconductor apparatus according to a comparison example.

In the etching of the ferroelectric capacitor material, in the case in which the first sidewall mask 54 is not present in the sidewall portion of the hard mask 20, a dropped portion (shoulder drop) on the upper sidewall portion (shoulder portion) of the hard mask 20 is generated during the etching of the ferroelectric capacitor material as shown in FIG. 3. Consequently, the hard mask 20 is thinned by a thickness L2 in the sidewall portion of the hard mask 20, for example.

In the semiconductor apparatus and the method for manufacturing the semiconductor apparatus according to the first embodiment, the first sidewall mask 54 is present in the sidewall portion. Consequently, it is possible to suppress the generation of the shoulder drop and to reduce the thickness L1 of the hard mask 20.

Figure 5:
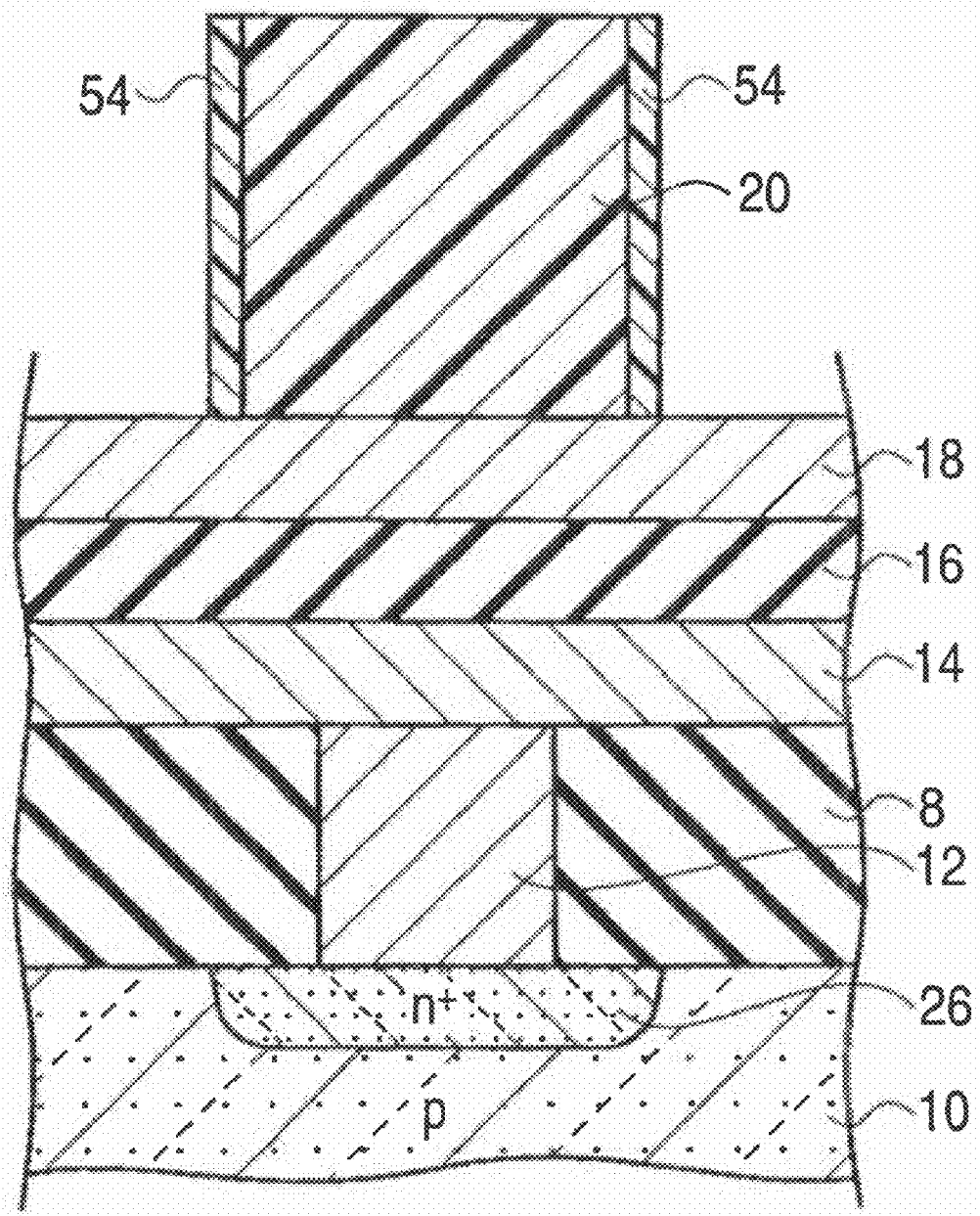
FIG. 5 is a typical sectional view showing a structure in one of steps of the method for manufacturing a semiconductor apparatus according to the first embodiment.

Accordingly, FIG. 5 shows an example in which the hard mask 20 is previously formed as a thin film and the first sidewall mask 54 is deposited over a whole surface, and the first sidewall mask 54 is etched back so that the first sidewall mask 54 is formed in the sidewall portion of the hard mask 20 as described above.

For example, in contrast to the thickness L1 of the hard mask 20, a thickness L5 of the first sidewall mask 54 deposited in the sidewall portion of the hard mask 20 is equal to or smaller than ($1/3$)×L1.

In the example of FIG. 5, an aspect ratio of the hard mask 20 with the first sidewall mask 54 formed on the sidewall portion of the hard mask 20 can be set to be lower than that in the example of FIG. 4.

Figure 6:
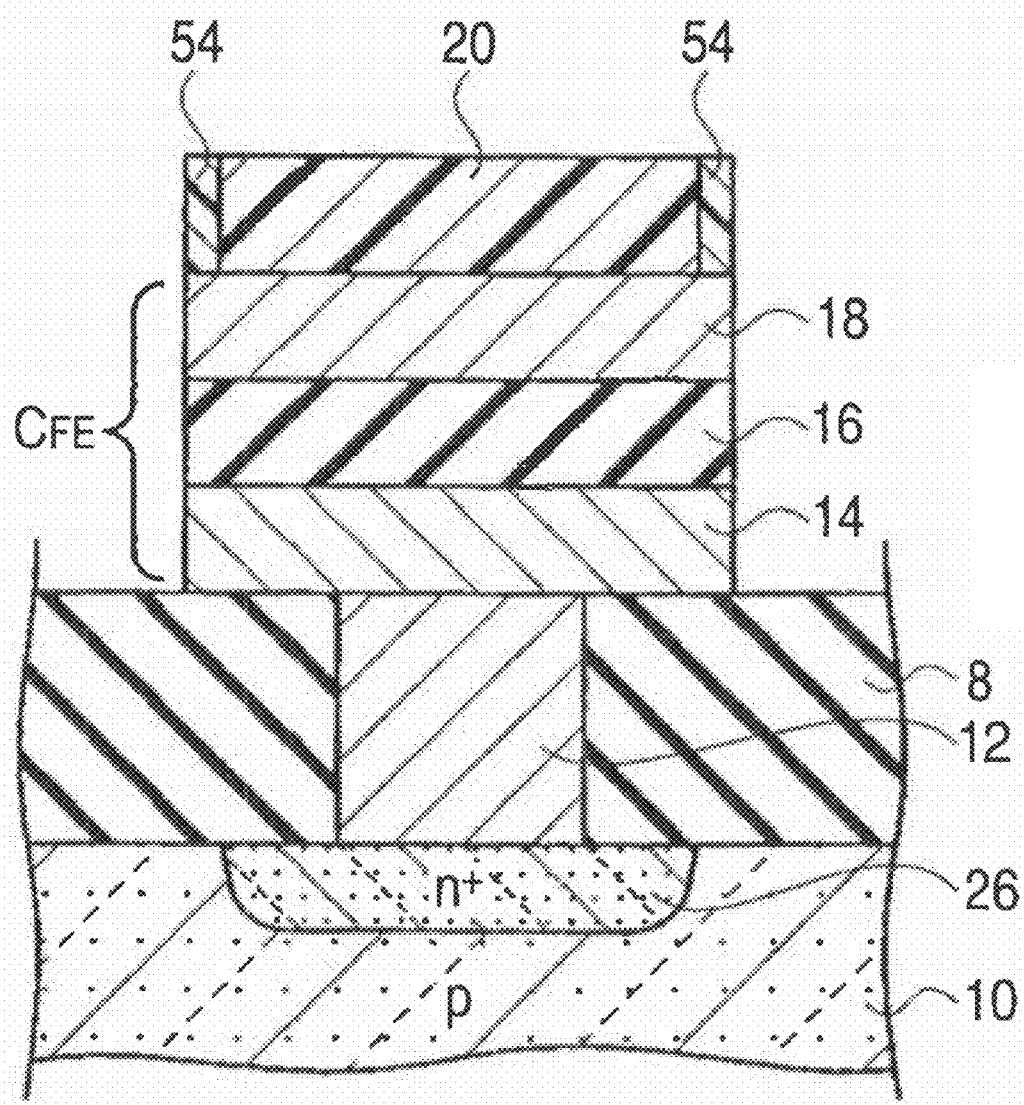
FIG. 6 is a typical sectional view showing a structure in one of steps of the method for manufacturing a semiconductor apparatus according to the first embodiment.

(d) As shown in FIG. 6, next, the upper electrode 18, the ferroelectric film 16 and the lower electrode 14 are subjected to a collective processing to form the ferroelectric capacitor $C_{FE}$ by using the hard mask 20 and the first sidewall mask 54 through an etching technique such as RIE.

A gas system for etching the ferroelectric capacitor material is as follows. As an etching gas for the lower electrode 14 formed of $SrRuO_3$, Pt, $IrO_2$, Ir or Ti, a chlorine-argon based gas is used, for example. As an etching gas for the ferroelectric film 16 formed of PZT ($Pb(Zr_xTi_{1-x})O_3$), for example, the chlorine-argon based gas is used. Referring to the upper electrode 18 formed of $SrRuO_3$ or $IrO_2$, similarly, the chlorine-argon based gas is used as an etching gas, for example.

According to the semiconductor apparatus and the method for manufacturing the semiconductor apparatus in accordance with the first embodiment, in the case in which the collective processing is performed by using the sidewall mask structure, the shoulder drop is not generated even if the hard mask 20 having a small thickness is used. Thus, the ferroelectric capacitor structure can easily be made minutely.

According to the semiconductor apparatus and the method for manufacturing the semiconductor apparatus in accordance with the first embodiment, as shown in FIGS. 7A and 7B, the thickness of the hard mask 20 can be reduced. As a result, a thickness L3 of the via hole electrode 22 in the memory cell portion can be reduced, and a thickness L4 of the via hole electrode 38 in the peripheral circuit portion can be reduced and an aspect ratio of a via hole contact portion can be thus reduced. Consequently, a manufacturing yield can also be enhanced.

According to the semiconductor apparatus and the method for manufacturing the semiconductor apparatus in accordance with the first embodiment, it is possible to form a minute FeRAM capacitor having a capacitor structure with a great taper angle by using the thinned hard mask.

According to the semiconductor apparatus and the method for manufacturing the semiconductor apparatus in accordance with the first embodiment, moreover, the sidewall mask is formed on the sidewall of the hard mask by a material having a high etching-selectivity for the ferroelectric capacitor material, and the sidewall mask is used to process and form the ferroelectric capacitor. Consequently, it is possible to decrease an area of the ferroelectric capacitor and to reduce an aspect ratio of a contact around the ferroelectric capacitor. By a reduction in a memory cell size and an enhancement in a reliability, thus, a cost can be reduced.

According to the semiconductor apparatus and the method for manufacturing the semiconductor apparatus in accordance with the first embodiment, it is possible to reduce the thickness of the hard mask. Therefore, it is possible to form a minute 1-Mask-FeRAM capacitor structure.

Second Embodiment

Figure 9:
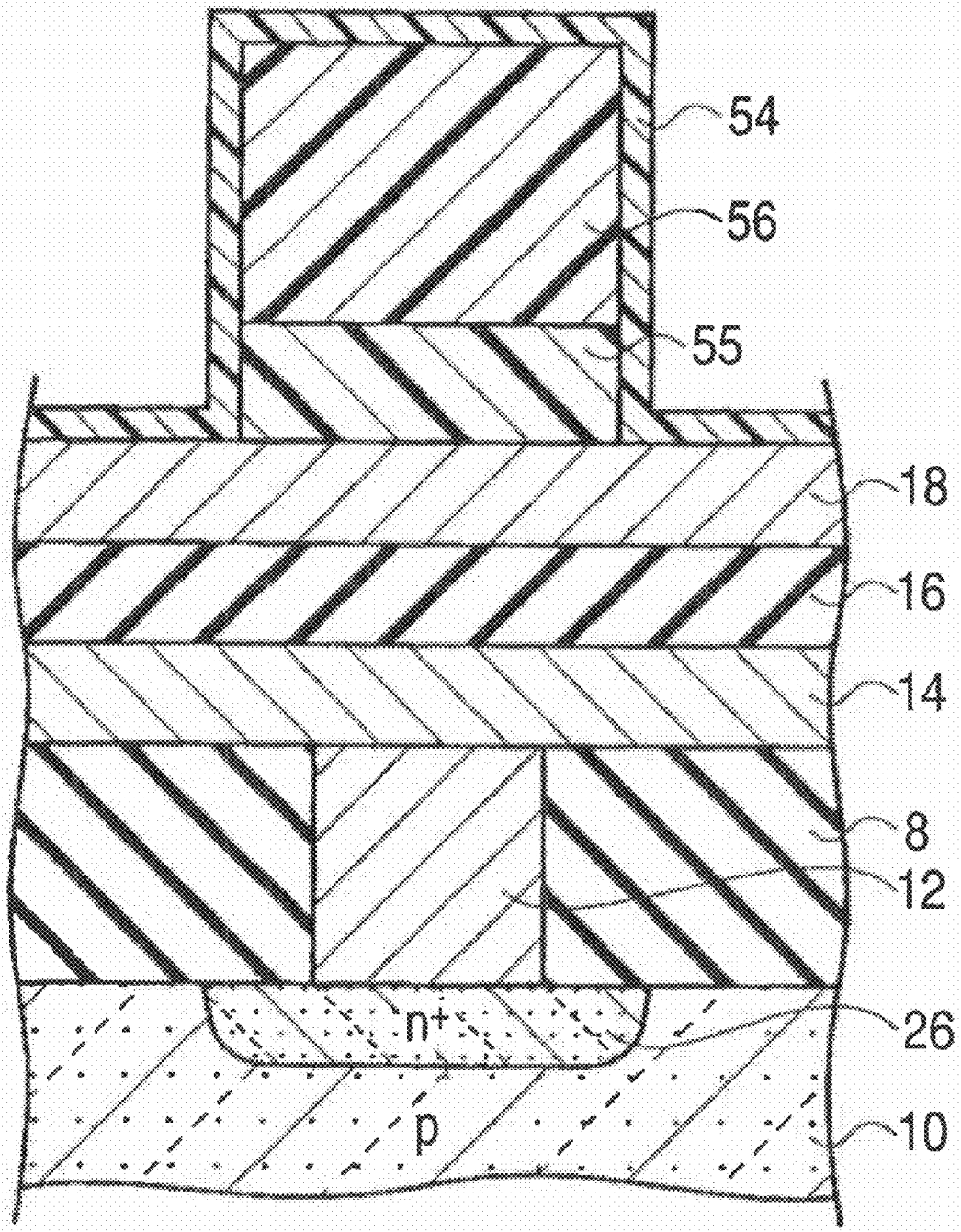
FIG. 9 is a typical sectional view showing a structure in one of steps of the method for manufacturing a semiconductor apparatus according to the second embodiment.
Figure 10:
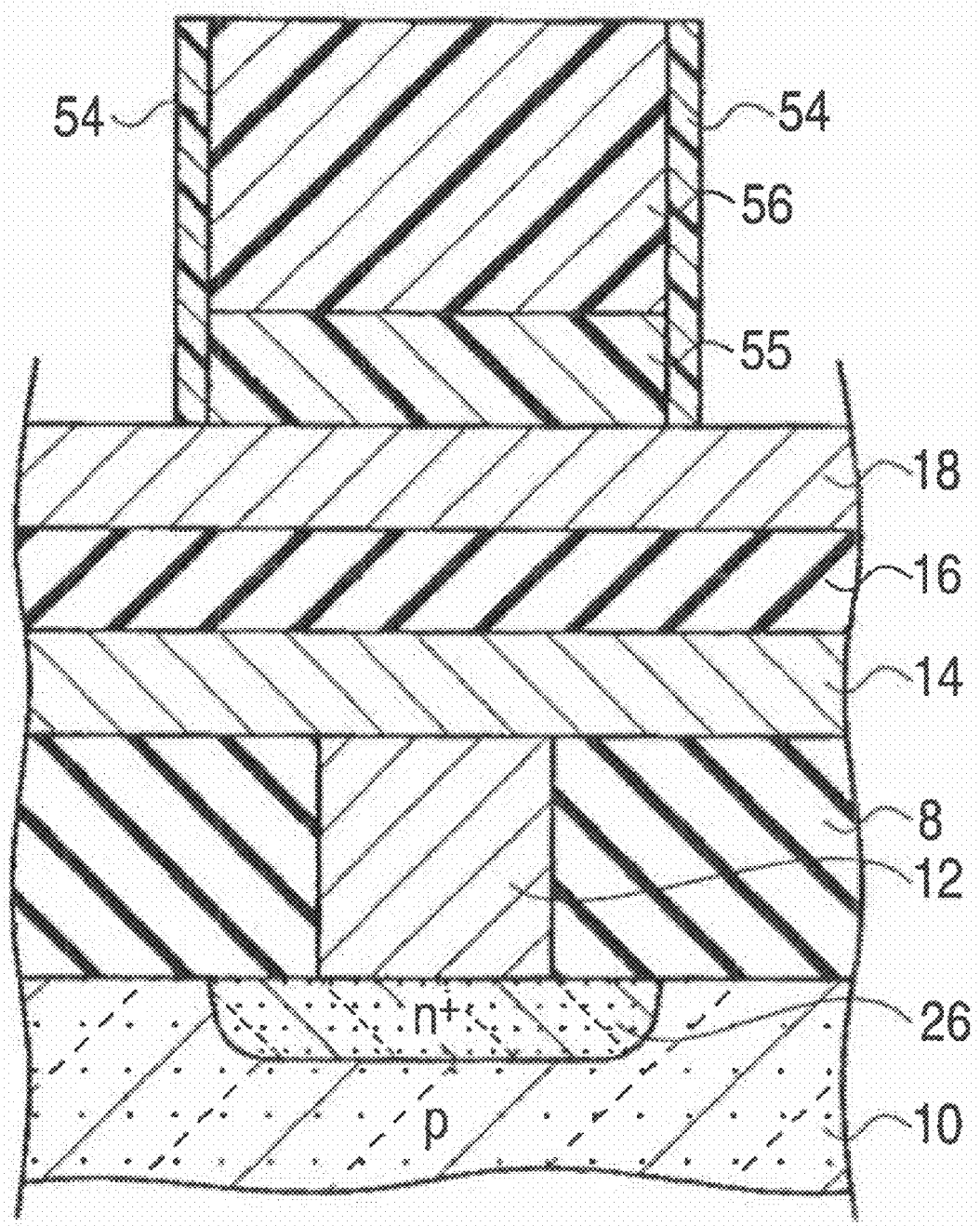
FIG. 10 is a typical sectional view showing a structure in one of steps of the method for manufacturing a semiconductor apparatus according to the second embodiment.
Figure 11:
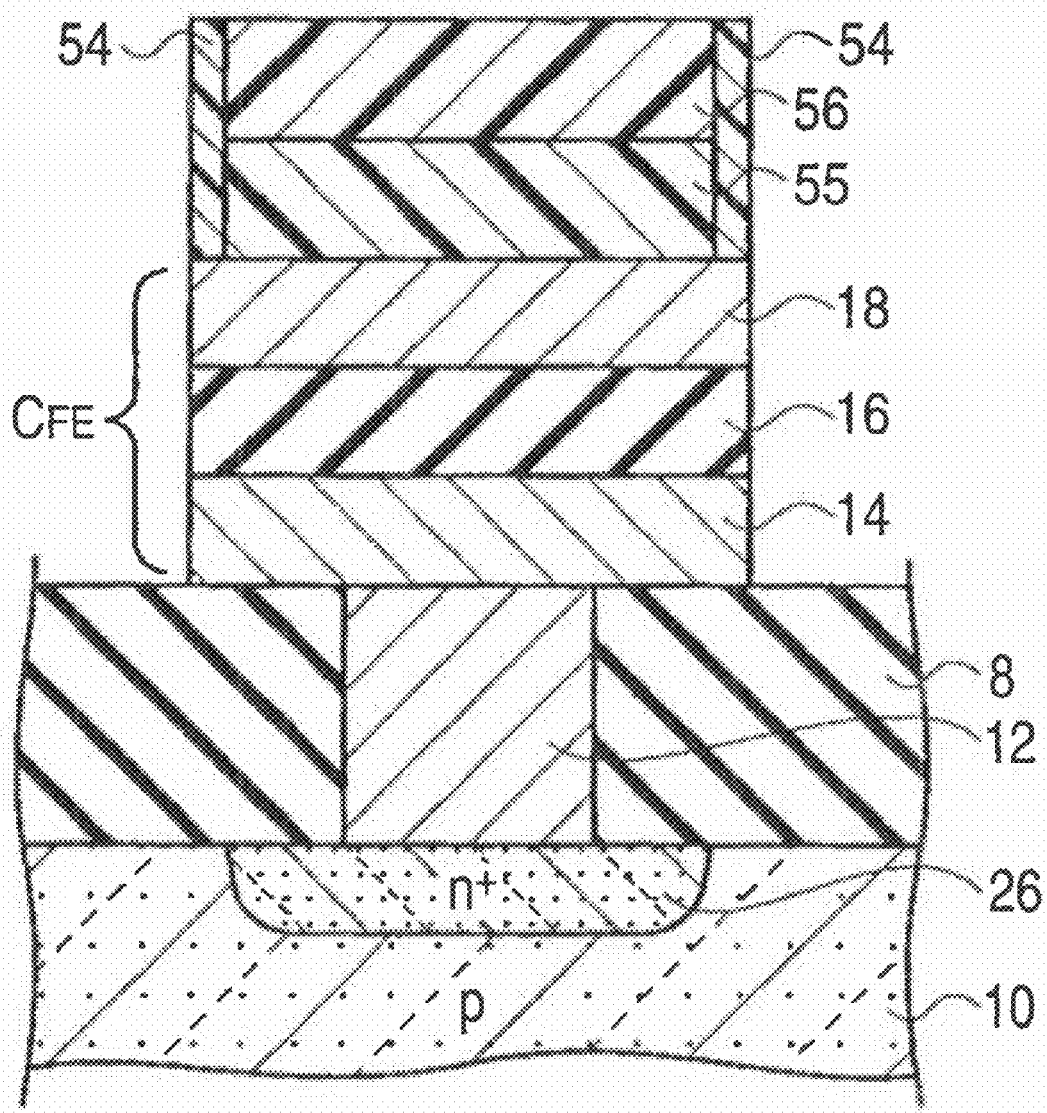
FIG. 11 is a typical sectional view showing a structure in one of steps of the method for manufacturing a semiconductor apparatus according to the second embodiment.

A typical sectional structure of steps in a method for manufacturing a semiconductor apparatus according to a second embodiment is shown in FIGS. 8 to 11. Moreover, FIG. 11 shows a typical sectional structure of a memory cell portion in the semiconductor apparatus according to the second embodiment.

(Device Structure)

As shown in FIG. 11, the semiconductor apparatus according to the second embodiment includes, in a memory cell portion, an interlayer insulating film 8 disposed on a semiconductor substrate 10, a ferroelectric capacitor $C_{FE}$ having a lower electrode 14 disposed on the interlayer insulating film 8, a ferroelectric film 16 disposed on the lower electrode 14, and an upper electrode 18 disposed on the ferroelectric film 16, a first hard mask 55 disposed on the upper electrode 18, a second hard mask 56 disposed on the first hard mask 55, and a first sidewall mask 54 disposed on a sidewall of the second hard mask 56 and that of the first hard mask 55. The first hard mask 55, the second hard mask 56 and the first sidewall mask 54 are functioning as an upper mask.

In the same manner as the semiconductor apparatus according to the first embodiment shown in FIG. 7A, the semiconductor apparatus according to the second embodiment includes, in the memory cell portion, a memory cell transistor MT having source-drain diffusion layers 26 and 28 disposed in the semiconductor substrate 10, a gate insulating film 32 disposed on the semiconductor substrate 10 between the source-drain diffusion layers 26 and 28, and a gate electrode 30 disposed on the gate insulating film 32.

In the same manner as in FIG. 7A, moreover, the semiconductor apparatus according to the second embodiment includes, in the memory cell portion, a plug electrode 12 disposed on the diffusion layer 26 in the source-drain diffusion layers 26 and 28 of the memory cell transistor MT, and the lower electrode 14 is connected to the plug electrode 12.

In the same manner as in FIG. 7B, furthermore, the semiconductor apparatus according to the second embodiment includes, in a peripheral circuit portion, a contact diffusion layer 34 disposed in the semiconductor substrate 10, the interlayer insulating film 8 disposed on the semiconductor substrate 10 in which the memory cell transistor MT is formed, a via hole electrode 38 disposed on the interlayer insulating film 8, and a wiring electrode 40 disposed on the via hole electrode 38.

In the semiconductor apparatus according to the second embodiment, as shown in FIG. 11, the lower electrode 14 of the ferroelectric capacitor $C_{FE}$ is connected to the source-drain diffusion layer 26 of the memory cell transistor MT. Therefore, the semiconductor apparatus according to the second embodiment can be applied to a TC unit series connection type FeRAM structure shown in FIGS. 21 and 22 or a 1T1C type FeRAM structure shown in FIG. 23 which will be described below, for example.

(Manufacturing Method)

As shown in FIGS. 8 to 11, the method for manufacturing the semiconductor apparatus according to the second embodiment includes, in the memory cell portion, the steps of forming the interlayer insulating film 8 on the semiconductor substrate 10, forming the ferroelectric capacitor $C_{FE}$ having the lower electrode 14 disposed on the interlayer insulating film 8, the ferroelectric film 16 disposed on the lower electrode 14 and the upper electrode 18 disposed on the ferroelectric film 16, forming the first hard mask 55 on the upper electrode 18, forming the second hard mask 56 on the first hard mask 55, and forming the first sidewall mask 54 on the sidewall of the first hard mask 55 and that of the second hard mask 56, and the step of forming the ferroelectric capacitor $C_{FE}$ has the step of performing a collective processing by using the second hard mask 56 and the first sidewall mask 54.

In the same manner as in FIG. 7A, moreover, the method for manufacturing the semiconductor apparatus according to the second embodiment includes, in the memory cell portion, the step of forming the memory cell transistor MT having the source-drain diffusion layers 26 and 28 disposed in the semiconductor substrate 10, the gate insulating film 32 disposed on the semiconductor substrate 10 between the source-drain diffusion layers 26 and 28, and the gate electrode 30 disposed on the gate insulating film 32.

In the same manner as in FIG. 7A, furthermore, the method for manufacturing the semiconductor apparatus according to the second embodiment includes, in the memory cell portion, the step of forming a contact hole on the second hard mask 56, forming a via hole electrode 22 in the contact hole, and furthermore, forming a wiring electrode 24 on the via hole electrode 22.

In addition, in the same manner as in FIG. 7A, the method for manufacturing the semiconductor apparatus according to the second embodiment includes the step of forming the plug electrode 12 on the diffusion layer 26 in the source-drain diffusion layers 26 and 28 of the memory cell transistor MT and forming the lower electrode 14 on the plug electrode 12.

In the same manner as in FIG. 7B, moreover, the method for manufacturing the semiconductor apparatus according to the second embodiment includes, in the peripheral circuit portion, the step of forming the contact diffusion layer 34 in the semiconductor substrate 10, forming a plug electrode 36 on the contact diffusion layer 34, forming the via hole electrode 38 on the plug electrode 36, and furthermore, forming the wiring electrode 40 on the via hole electrode 38.

With reference to the drawings, the manufacturing process will be described below in detail.

Figure 8:
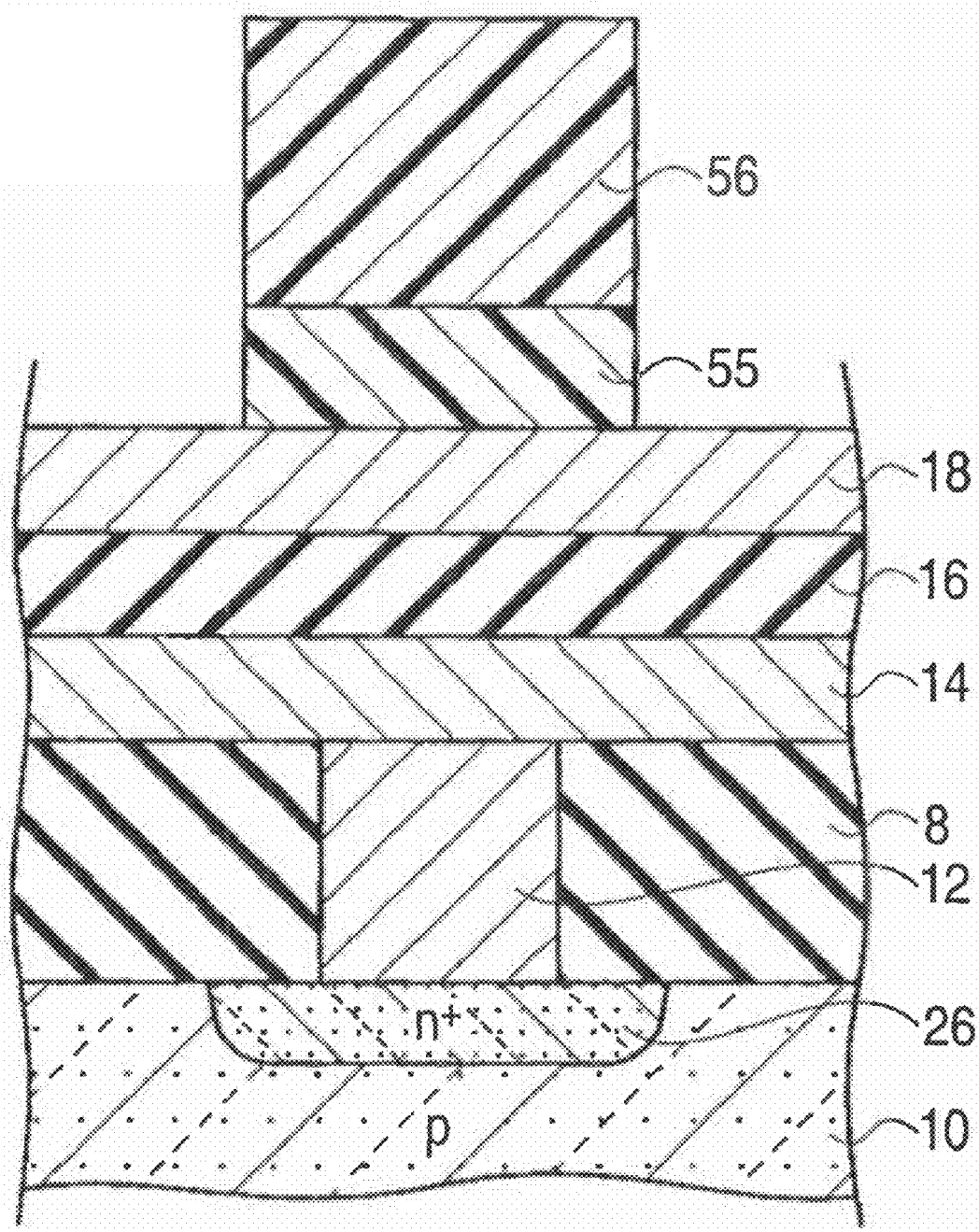
FIG. 8 is a typical sectional view showing a structure in one of steps of a method for manufacturing a semiconductor apparatus according to a second embodiment.

(a) First of all, as shown in FIG. 8, the first hard mask 55 and the second hard mask 56 are formed on the upper electrode 18, for example, and an etching technique such as RIE is used to process the first hard mask 55 and the second hard mask 56.

As a material of the first hard mask 55, for example, an aluminum oxide film ($Al_xO_Y$) can be used. As a material of the second hard mask 56, for example, an oxide film ($SiO_2$) can be used.

In the case in which an alumina film ($Al_2O_3$) is used as the first hard mask 55, a sputtering method having a lower damage is utilized for suppressing a damage caused over a ferroelectric capacitor, for example. In the case in which the oxide film ($SiO_2$) is used as the second hard mask 56, moreover, a plasma CVD method is used.

More specifically, the following steps are used. First of all, a photoresist film is used to process the second hard mask 56 portion constituted by the oxide film ($SiO_2$), and the photoresist film is removed by ashing and the second hard mask 56 itself which is constituted by the oxide film ($SiO_2$) is then used to process the first hard mask 55 constituted by the alumina film ($Al_2O_3$) through the RIE.

The reason why the alumina film ($Al_2O_3$) is used as the first hard mask 55 is that a damage can be prevented from being caused over the ferroelectric capacitor by the presence of the alumina film ($Al_2O_3$) when depositing the second hard mask 56 constituted by the oxide film ($SiO_2$) through the plasma CVD method and the alumina film ($Al_2O_3$) to be the first hard mask 55 has a high etching-selectivity for Ir or $IrO_2$ to be the material of the lower electrode 14.

For a multilayer hard mask material constituted by the first hard mask 55 and the second hard mask 56, moreover, it is also possible to use at least one of a zirconium oxide film ($ZrO_X$), a titanium oxide film ($TiO_X$), a titanium aluminum nitride film ($TiAl_xN_Y$), a titanium nitride film ($Ti_xN_Y$), a titanium aluminum nitride oxide film ($TiAl_xN_YO_Z$) and a titanium nitride oxide film ($Ti_xN_YO_Z$ film) in addition to the silicon oxide film ($SiO_2$) and the aluminum oxide film ($Al_xO_Y$).

(b) As shown in FIG. 9, next, the first sidewall mask 54 is deposited over a whole surface.

For a material of the first sidewall mask 54, it is preferable to use a material having a higher etching-selectivity than the second hard mask 56.

As the material of the first side wall mask 54, for example, it is possible to use at least one of an oxide film ($SiO_2$), an aluminum oxide film ($Al_xO_Y$), a zirconium oxide film ($ZrO_X$), a titanium oxide film ($TiO_X$), a titanium aluminum nitride film ($TiAl_xN_Y$), a titanium nitride film ($Ti_xN_Y$), a titanium aluminum nitride oxide film ($TiAl_xN_YO_Z$) and a titanium nitride oxide film ($Ti_xN_YO_Z$).

As a method for depositing the first sidewall mask 54, for example, it is possible to use an ALD method. In the case in which an aluminum oxide film ($Al_2O_3$) is used, a deposited film has a thickness of approximately 20 nm.

(c) As shown in FIG. 10, then, a whole surface is etched back to form the first sidewall mask 54 in the sidewall portions of the first hard mask 55 and the second hard mask 56.

For example, in contrast to a thickness L1 of a lamination structure of the first hard mask 55 and the second hard mask 56, a thickness L5 of the first sidewall mask 54 deposited in the sidewall portion is equal to or smaller than (⅓)×L1.

In the example of FIG. 10, an aspect ratio of the lamination structure of the first hard mask 55 and the second hard mask 56 with the first side wall mask 54 formed on the sidewall portions thereof can be set to be low.

(d) As shown in FIG. 11, next, the upper electrode 18, the ferroelectric film 16 and the lower electrode 14 are subjected to a collective processing to form the ferroelectric capacitor $C_{FE}$ by using the second hard mask 56 and the first sidewall mask 54 through an etching technique such as RIE.

In the example of FIG. 11, the second hard mask 56 is left in a predetermined thickness. Depending on etching conditions, however, the thickness of the second hard mask 56 is further reduced or the second hard mask 56 is completely etched and removed in some cases.

A gas system for etching the ferroelectric capacitor material is as follows. As an etching gas for the lower electrode 14 formed of $SrRuO_3$, Pt, $IrO_2$, Ir or Ti, a chlorine-argon based gas is used, for example. As an etching gas for the ferroelectric film 16 formed of PZT ($Pb(Zr_xTi_{1-x})O_3$), for example, the chlorine-argon based gas is used. Referring to the upper electrode 18 formed of $SrRuO_3$ or $IrO_2$, similarly, the chlorine-argon based gas is used as an etching gas, for example.

According to the semiconductor apparatus and the method for manufacturing the semiconductor apparatus in accordance with the second embodiment, in the case in which the collective processing is performed by using the sidewall mask structure, the shoulder drop is not generated even if the first hard mask 55 and the second hard mask 56 which have small thicknesses are used. Thus, a minuteness can easily be increased.

According to the semiconductor apparatus and the method for manufacturing the semiconductor apparatus in accordance with the second embodiment, as shown in FIGS. 7A and 7B, the thicknesses of the first hard mask 55 and the second hard mask 56 can be reduced. As a result, a thickness L3 of the via hole electrode 22 in the memory cell portion can be reduced, and a thickness L4 of the via hole electrode 38 in the peripheral circuit portion can be reduced and an aspect ratio of a via hole contact portion can be thus reduced. Consequently, a manufacturing yield can also be enhanced.

According to the semiconductor apparatus and the method for manufacturing the semiconductor apparatus in accordance with the second embodiment, it is possible to form a minute FeRAM capacitor having a capacitor structure with a great taper angle by using the thinned hard mask.

According to the semiconductor apparatus and the method for manufacturing the semiconductor apparatus in accordance with the second embodiment, moreover, the sidewall mask is formed on the sidewall of the hard mask by a material having a high etching-selectivity for the ferroelectric capacitor material, and the sidewall mask is used to process and form the ferroelectric capacitor. Consequently, it is possible to decrease an area of the ferroelectric capacitor and to reduce an aspect ratio of a contact around the ferroelectric capacitor. By a reduction in a memory cell size and an enhancement in a reliability, thus, a cost can be reduced.

According to the semiconductor apparatus and the method for manufacturing the semiconductor apparatus in accordance with the second embodiment, it is possible to reduce the thickness of the hard mask. Therefore, it is possible to form a minute 1-Mask-FeRAM capacitor structure.

Third Embodiment

Figure 12:
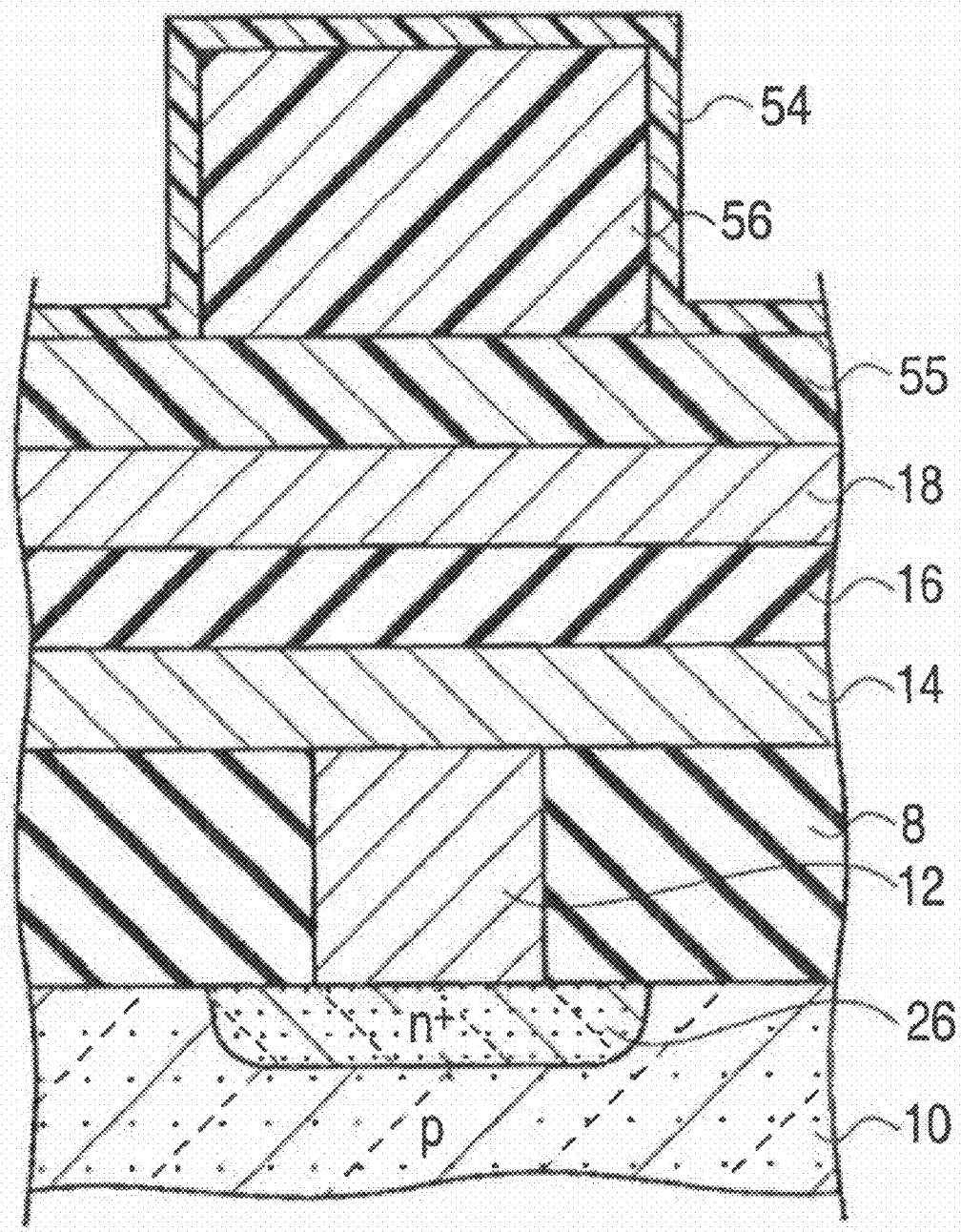
FIG. 12 is a typical sectional view showing a structure in one of steps of a method for manufacturing a semiconductor apparatus according to a third embodiment.
Figure 13:
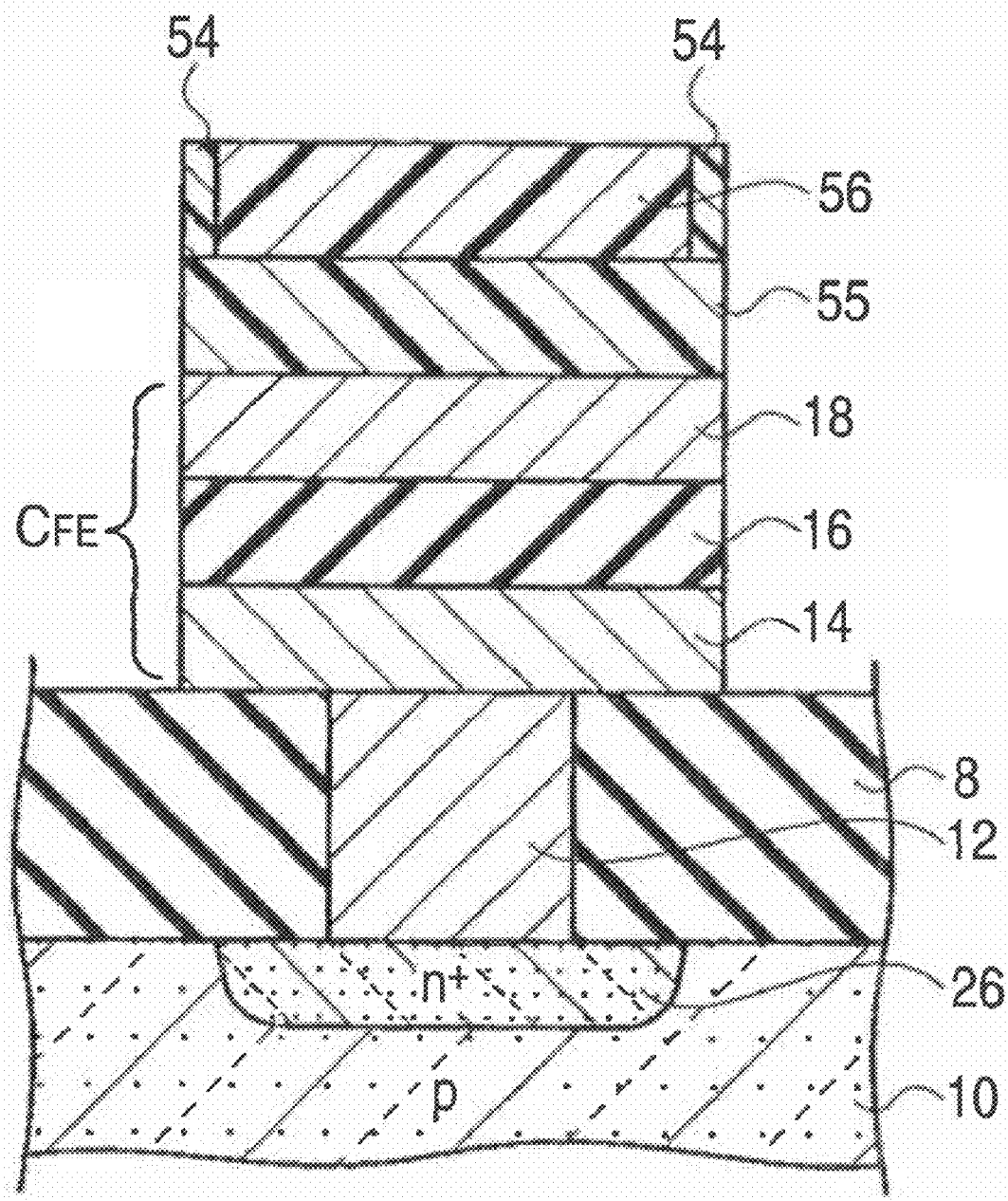
FIG. 13 is a typical sectional view showing a structure in one of steps of the method for manufacturing a semiconductor apparatus according to the third embodiment.

A typical sectional structure of steps in a method for manufacturing a semiconductor apparatus according to a third embodiment is shown in FIGS. 12 and 13. Moreover, FIG. 13 shows a typical sectional structure of a memory cell portion in a semiconductor apparatus according to the third embodiment.

(Device Structure)

As shown in FIG. 13, the semiconductor apparatus according to the third embodiment includes, in a memory cell portion, an interlayer insulating film 8 disposed on a semiconductor substrate 10, a ferroelectric capacitor $C_{FE}$ having a lower electrode 14 disposed on the interlayer insulating film 8, a ferroelectric film 16 disposed on the lower electrode 14, and an upper electrode 18 disposed on the ferroelectric film 16, a first hard mask 55 disposed on the upper electrode 18, a second hard mask 56 disposed on the first hard mask 55, and a first sidewall mask 54 disposed on a sidewall of the second hard mask 56. The first hard mask 55, the second hard mask 56 and the first sidewall mask 54 are functioning as an upper mask.

In the same manner as the semiconductor apparatus according to the first embodiment shown in FIG. 7A, the semiconductor apparatus according to the third embodiment includes, in the memory cell portion, a memory cell transistor MT having source-drain diffusion layers 26 and 28 disposed in the semiconductor substrate 10, a gate insulating film 32 disposed on the semiconductor substrate 10 between the source-drain diffusion layers 26 and 28, and a gate electrode 30 disposed on the gate insulating film 32.

In the same manner as in FIG. 7A, moreover, the semiconductor apparatus according to the third embodiment includes, in the memory cell portion, a plug electrode 12 disposed on the diffusion layer 26 in the source-drain diffusion layers 26 and 28 of the memory cell transistor MT, and the lower electrode 14 is connected to the plug electrode 12.

In the same manner as in FIG. 7B, furthermore, the semiconductor apparatus according to the third embodiment includes, in a peripheral circuit portion, a contact diffusion layer 34 disposed in the semiconductor substrate 10, the interlayer insulating film 8 disposed on the semiconductor substrate 10 in which the memory cell transistor MT is formed, a via hole electrode 38 disposed on the interlayer insulating film 8, and a wiring electrode 40 disposed on the via hole electrode 38.

In the semiconductor apparatus according to the third embodiment, as shown in FIG. 13, the lower electrode 14 of the ferroelectric capacitor $C_{FE}$ is connected to the source-drain diffusion layer 26 of the memory cell transistor MT. Therefore, the semiconductor apparatus according to the third embodiment can be applied to a TC unit series connection type FeRAM structure shown in FIGS. 21 and 22 or a 1T1C type FeRAM structure shown in FIG. 23 which will be described below, for example.

(Manufacturing Method)

As shown in FIGS. 12 and 13, the method for manufacturing the semiconductor apparatus according to the third embodiment includes, in the memory cell portion, the steps of forming the interlayer insulating film 8 on the semiconductor substrate 10, forming the ferroelectric capacitor $C_{FE}$ having the lower electrode 14 disposed on the interlayer insulating film 8, the ferroelectric film 16 disposed on the lower electrode 14 and the upper electrode 18 disposed on the ferroelectric film 16, forming the first hard mask 55 on the upper electrode 18, forming the second hard mask 56 on the first hard mask 55, and forming the first sidewall mask 54 on the sidewall of the second hard mask 56, and the step of forming the ferroelectric capacitor $C_{FE}$ has the step of performing a collective processing by using the second hard mask 56 and the first sidewall mask 54.

In the same manner as in FIG. 7A, moreover, the method for manufacturing the semiconductor apparatus according to the third embodiment includes, in the memory cell portion, the step of forming the memory cell transistor MT having the source-drain diffusion layers 26 and 28 disposed in the semiconductor substrate 10, the gate insulating film 32 disposed on the semiconductor substrate 10 between the source-drain diffusion layers 26 and 28, and the gate electrode 30 disposed on the gate insulating film 32.

In the same manner as in FIG. 7A, furthermore, the method for manufacturing the semiconductor apparatus according to the third embodiment includes, in the memory cell portion, the step of forming a contact hole on the second hard mask 56, forming a via hole electrode 22 in the contact hole, and furthermore, forming a wiring electrode 24 on the via hole electrode 22.

In addition, in the same manner as in FIG. 7A, the method for manufacturing the semiconductor apparatus according to the third embodiment includes, in the memory cell portion, the step of forming the plug electrode 12 on the diffusion layer 26 in the source-drain diffusion layers 26 and 28 of the memory cell transistor MT and forming the lower electrode 14 on the plug electrode 12.

In the same manner as in FIG. 7B, moreover, the method for manufacturing the semiconductor apparatus according to the third embodiment includes, in the peripheral circuit portion, the step of forming the contact diffusion layer 34 in the semiconductor substrate 10, forming a plug electrode 36 on the contact diffusion layer 34, forming the via hole electrode 38 on the plug electrode 36, and furthermore, forming the wiring electrode 40 on the via hole electrode 38.

With reference to the drawings, the manufacturing process will be described below in detail.

(a) First of all, as shown in FIG. 12, the first hard mask 55 and the second hard mask 56 are formed on the upper electrode 18, for example, and an etching technique such as RIE is used to process the second hard mask 56.

As a material of the first hard mask 55, for example, an aluminum oxide film ($Al_xO_y$) can be used. As a material of the second hard mask 56, for example, an oxide film ($SiO_2$) can be used.

In case of the structure of the semiconductor apparatus according to the third embodiment in which an aluminum oxide film ($Al_xO_y$) is used as the material of the first hard mask 55, for example, it is possible to suppress a damage when depositing an $Al_2O_3$ film as the first sidewall mask 54 by an ALD method. Thus, it is possible to obtain a more excellent capacitor characteristic.

In the case in which an alumina film ($Al_2O_3$) is used as the first hard mask 55, a sputtering method having a lower damage is utilized for suppressing a damage caused over a ferroelectric capacitor, for example. In the case in which the oxide film ($SiO_2$) is used as the second hard mask 56, moreover, a plasma CVD method is used.

More specifically, the following steps are used. First of all, a photoresist film is used to process the second hard mask 56 portion constituted by the oxide film ($SiO_2$), and the photoresist film is removed by ashing.

The reason why the alumina film ($Al_2O_3$) is used as the first hard mask 55 is that a damage can be prevented from being caused over the ferroelectric capacitor by the presence of the alumina film ($Al_2O_3$) when depositing the second hard mask 56 constituted by the oxide film ($SiO_2$) through the plasma CVD method and the alumina film ($Al_2O_3$) to be the first hard mask 55 has a high etching-selectivity for Ir or $IrO_2$ to be the material of the lower electrode 14.

For a multilayer hard mask material constituted by the first hard mask 55 and the second hard mask 56, moreover, it is also possible to use at least one of a zirconium oxide film ($ZrO_X$), a titanium oxide film ($TiO_X$), a titanium aluminum nitride film ($TiAl_XN_Y$), a titanium nitride film ($Ti_XN_Y$), a titanium aluminum nitride oxide film ($TiAl_XN_YO_Z$) and a titanium nitride oxide film ($Ti_XN_YO_Z$ film) in addition to the silicon oxide film ($SiO_2$) and the aluminum oxide film ($Al_XO_Y$).

(b) As shown in FIG. 12, furthermore, the first sidewall mask 54 is deposited over a whole surface.

For example, in contrast to a thickness L1 of the second hard mask 56, a thickness L5 of the first sidewall mask 54 deposited in the sidewall portion of the second hard mask 56 is equal to or smaller than (⅓)×L1. In the example of FIG. 12, an aspect ratio of the second hard mask 56 with the first sidewall mask 54 formed on the sidewall portion thereof can be set to be low.

For a material of the first sidewall mask 54, it is preferable to use a material having a higher etching-selectivity than the second hard mask 56.

As the material of the first sidewall mask 54, for example, it is possible to use at least one of an oxide film ($SiO_2$), an aluminum oxide film ($Al_XO_Y$), a zirconium oxide film ($ZrO_X$), a titanium oxide film ($TiO_X$), a titanium aluminum nitride film ($TiAl_XN_Y$), a titanium nitride film ($Ti_XN_Y$), a titanium aluminum nitride oxide film ($TiAl_XN_YO_Z$) and a titanium nitride oxide film ($Ti_XN_YO_Z$).

As a method for depositing the first sidewall mask 54, for example, it is possible to use an ALD method. In the case in which an aluminum oxide film ($Al_2O_3$) is used as the first sidewall mask 54, for example, a deposited film has a thickness of approximately 20 nm.

The ALD method itself is a CVD method and it is impossible to disregard a damage over the ferroelectric capacitor in the deposition in order to use an organic metal material containing a hydrogen group. In order to suppress the damage, therefore, a sputtering method containing no hydrogen group during a film formation is used at the step of forming the $Al_2O_3$ film as the first hard mask 55 in the multilayer mask formed by the first hard mask 55 and the second hard mask 56.

(c) As shown in FIG. 13, then, a whole surface is etched back to form the first sidewall mask 54 in the sidewall portion of the second hard mask 56.

(d) As shown in FIG. 13, furthermore, the first hard mask 55, the upper electrode 18, the ferroelectric film 16 and the lower electrode 14 are subjected to a collective processing to form the ferroelectric capacitor $C_{FE}$ by using the second hard mask 56 and the first sidewall mask 54 through an etching technique such as RIE.

In the example of FIG. 13, the second hard mask 56 is left in a predetermined thickness. Depending on etching conditions, however, the thickness of the second hard mask 56 is further reduced or the second hard mask 56 is completely etched and removed in some cases.

In addition, in the example of FIG. 13, the ferroelectric capacitor $C_{FE}$ portion is formed in a taper angle of 90 degrees. However, the taper angle of the ferroelectric capacitor $C_{FE}$ portion is not restricted to 90 degrees but is 70 to 89 degrees depending on conditions in the etching in some cases, for example.

A gas system for etching the ferroelectric capacitor material is as follows. As an etching gas for the lower electrode 14 formed of $SrRuO_3$, Pt, $IrO_2$, Ir or Ti, a chlorine-argon based gas is used, for example. As an etching gas for the ferroelectric film 16 formed of PZT ($Pb(Zr_xTi_{1-x})O_3$), for example, the chlorine-argon based gas is used. Referring to the upper electrode 18 formed of $SrRuO_3$ or $IrO_2$, similarly, the chlorine-argon based gas is used as an etching gas, for example.

According to the semiconductor apparatus and the method for manufacturing the semiconductor apparatus in accordance with the third embodiment, in the case in which the collective processing is performed by using the sidewall mask structure, the shoulder drop is not generated even if the first hard mask 55 and the second hard mask 56 which have small thicknesses are used. Thus, a minuteness can easily be increased.

According to the semiconductor apparatus and the method for manufacturing the semiconductor apparatus in accordance with the third embodiment, in the same manner as in the first and second embodiments, the thicknesses of the first hard mask 55 and the second hard mask 56 can be reduced as shown in FIGS. 7A and 7B. As a result, a thickness L3 of the via hole electrode 22 in the memory cell portion can be reduced, and a thickness L4 of the via hole electrode 38 in the peripheral circuit portion can be reduced and an aspect ratio of a via hole contact portion can be thus reduced. Consequently, a manufacturing yield can also be enhanced.

According to the semiconductor apparatus and the method for manufacturing the semiconductor apparatus in accordance with the third embodiment, in the same manner as in the first and second embodiments, it is possible to form a minute FeRAM capacitor having a capacitor structure with a great taper angle by using the thinned hard mask.

According to the semiconductor apparatus and the method for manufacturing the semiconductor apparatus in accordance with the third embodiment, in the same manner as in the first and second embodiments, the sidewall mask is formed on the sidewall of the hard mask by a material having a high etching-selectivity for the ferroelectric capacitor material, and the sidewall mask is used to process and form the ferroelectric capacitor. Consequently, it is possible to decrease an area of the ferroelectric capacitor and to reduce an aspect ratio of a contact around the ferroelectric capacitor. By a reduction in a memory cell size and an enhancement in a reliability, thus, a cost can be reduced.

According to the semiconductor apparatus and the method for manufacturing the semiconductor apparatus in accordance with the third embodiment, in the same manner as in the first and second embodiments, it is possible to reduce the thickness of the hard mask. Therefore, it is possible to form a minute 1-Mask-FeRAM capacitor structure.

Fourth Embodiment

Figure 14:
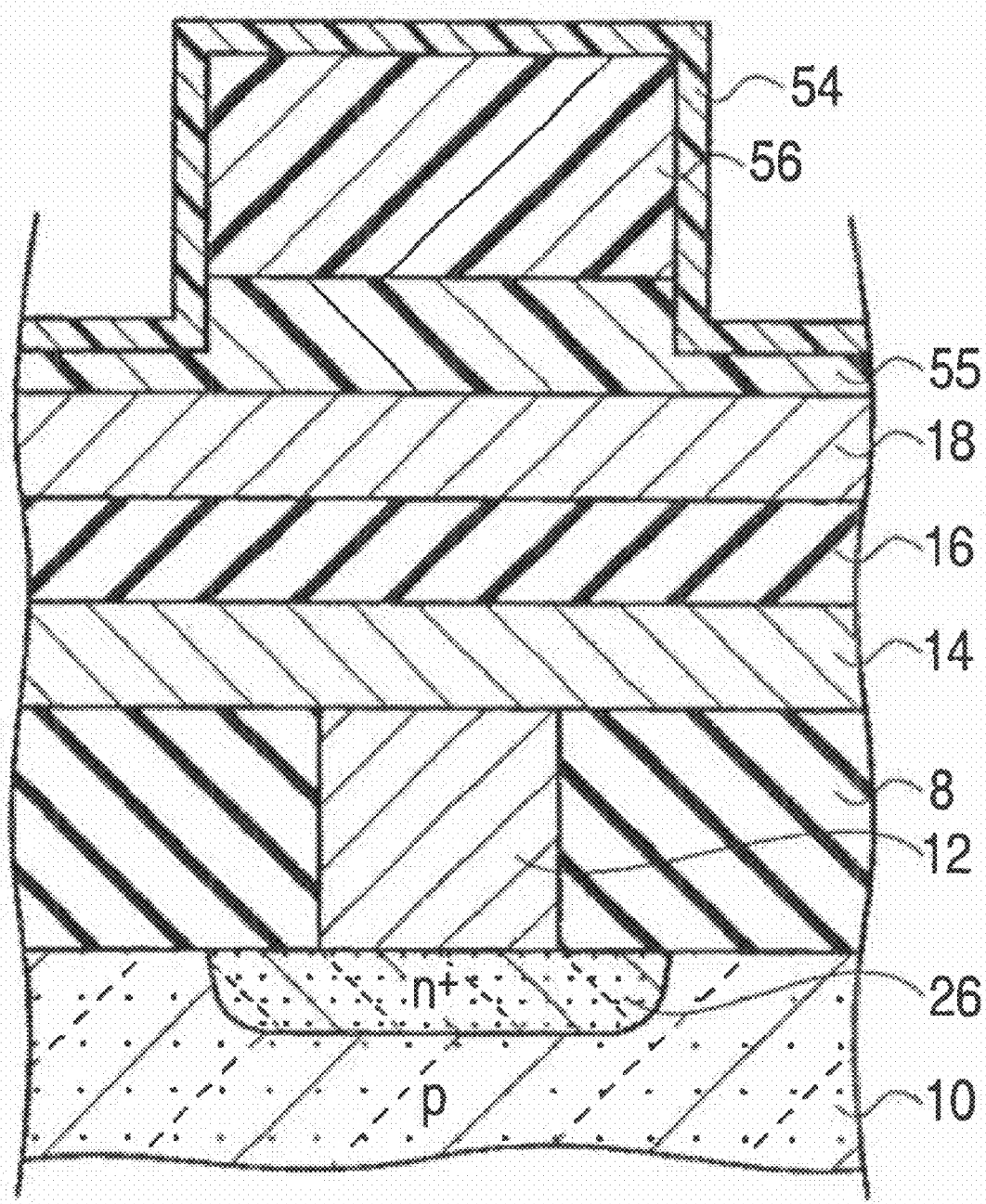
FIG. 14 is a typical sectional view showing a structure in one of steps of a method for manufacturing a semiconductor apparatus according to a fourth embodiment.
Figure 15:
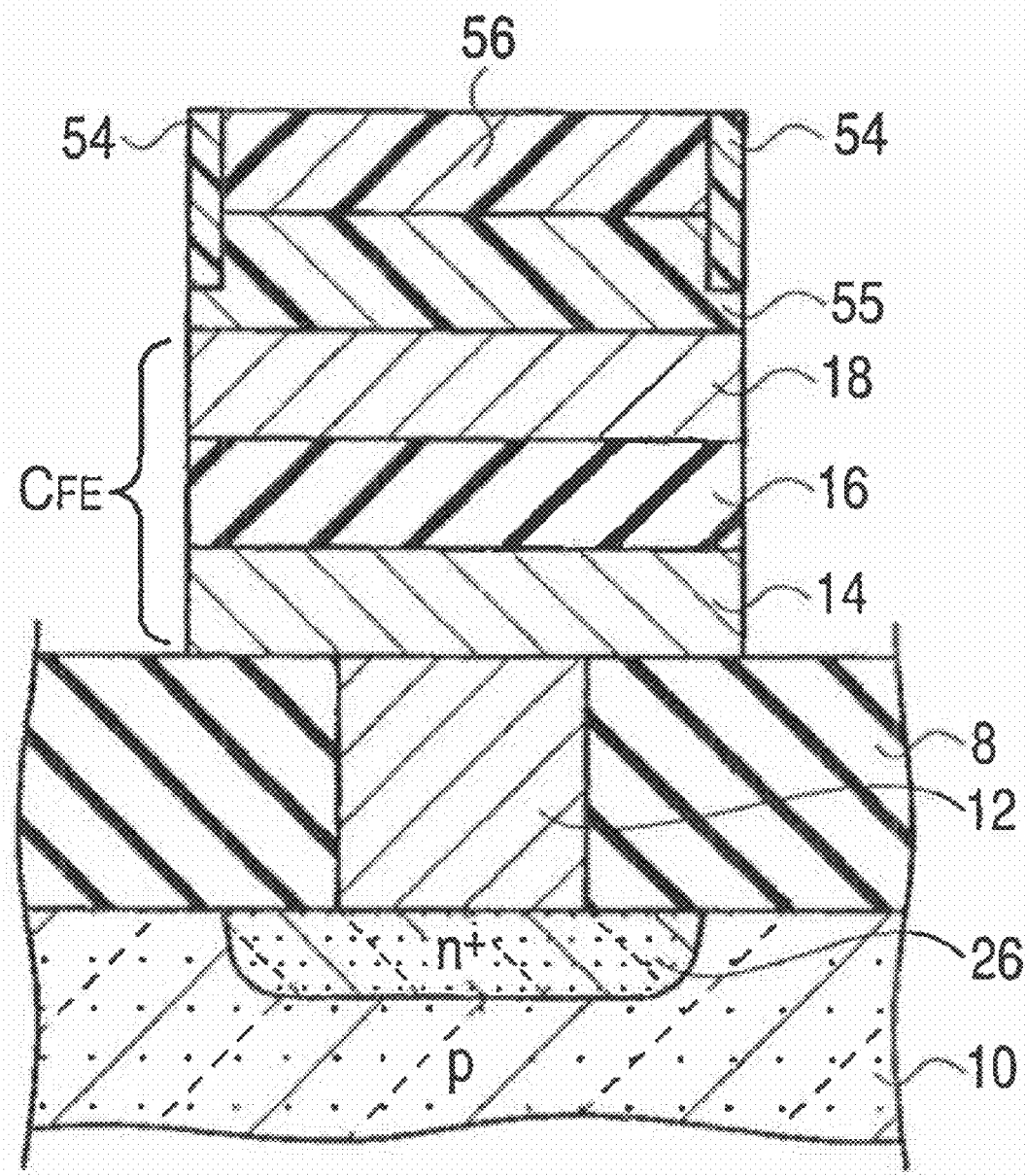
FIG. 15 is a typical sectional view showing a structure in one of steps of the method for manufacturing a semiconductor apparatus according to the fourth embodiment.

A typical sectional structure of steps in a method for manufacturing a semiconductor apparatus according to a fourth embodiment is shown in FIGS. 14 and 15. Moreover, FIG. 15 shows a typical sectional structure of a memory cell portion in the semiconductor apparatus according to the fourth embodiment.

(Device Structure)

As shown in FIG. 15, the semiconductor apparatus according to the fourth embodiment includes, in a memory cell portion, an interlayer insulating film 8 disposed on a semiconductor substrate 10, a ferroelectric capacitor $C_{FE}$ having a lower electrode 14 disposed on the interlayer insulating film 8, a ferroelectric film 16 disposed on the lower electrode 14, and an upper electrode 18 disposed on the ferroelectric film 16, a first hard mask 55 disposed on the upper electrode 18, a second hard mask 56 disposed on the first hard mask 55, and a first sidewall mask 54 disposed on a sidewall of the second hard mask 56 and a part of a sidewall of the first hard mask 55. The first hard mask 55, the second hard mask 56 and the first sidewall mask 54 are functioning as an upper mask.

In the same manner as the semiconductor apparatus according to the fourth embodiment shown in FIG. 7A, the semiconductor apparatus according to the second embodiment includes, in the memory cell portion, a memory cell transistor MT having source-drain diffusion layers 26 and 28 disposed in the semiconductor substrate 10, a gate insulating film 32 disposed on the semiconductor substrate 10 between the source-drain diffusion layers 26 and 28, and a gate electrode 30 disposed on the gate insulating film 32.

In the same manner as in FIG. 7A, moreover, the semiconductor apparatus according to the fourth embodiment includes, in the memory cell portion, a plug electrode 12 disposed on the diffusion layer 26 in the source-drain diffusion layers 26 and 28 of the memory cell transistor MT, and the lower electrode 14 is connected to the plug electrode 12.

In the same manner as in FIG. 7B, furthermore, the semiconductor apparatus according to the fourth embodiment includes, in a peripheral circuit portion, a contact diffusion layer 34 disposed in the semiconductor substrate 10, the interlayer insulating film 8 disposed on the semiconductor substrate 10 in which the memory cell transistor MT is formed, a via hole electrode 38 disposed on the interlayer insulating film 8, and a wiring electrode 40 disposed on the via hole electrode 38.

In the semiconductor apparatus according to the fourth embodiment, as shown in FIG. 15, the lower electrode 14 of the ferroelectric capacitor $C_{FE}$ is connected to the source-drain diffusion layer 26 of the memory cell transistor MT. Therefore, the semiconductor apparatus according to the fourth embodiment can be applied to a TC unit series connection type FeRAM structure shown in FIGS. 21 and 22 or a 1T1C type FeRAM structure shown in FIG. 23 which will be described below, for example.

(Manufacturing Method)

As shown in FIGS. 14 and 15, the method for manufacturing the semiconductor apparatus according to the fourth embodiment includes, in the memory cell portion, the steps of forming the interlayer insulating film 8 on the semiconductor substrate 10, forming the ferroelectric capacitor $C_{FE}$ having the lower electrode 14 disposed on the interlayer insulating film 8, the ferroelectric film 16 disposed on the lower electrode 14 and the upper electrode 18 disposed on the ferroelectric film 16, forming the first hard mask 55 on the upper electrode 18, forming the second hard mask 56 on the first hard mask 55, and forming the first sidewall mask 54 on the sidewall of the second hard mask 56 and a part of the sidewall of the first hard mask 55, and the step of forming the ferroelectric capacitor $C_{FE}$ has the step of performing a collective processing by using the second hard mask 56 and the first sidewall mask 54.

In the same manner as in FIG. 7A, moreover, the method for manufacturing the semiconductor apparatus according to the fourth embodiment includes, in the memory cell portion, the step of forming the memory cell transistor MT having the source-drain diffusion layers 26 and 28 disposed in the semiconductor substrate 10, the gate insulating film 32 disposed on the semiconductor substrate 10 between the source-drain diffusion layers 26 and 28, and the gate electrode 30 disposed on the gate insulating film 32.

In the same manner as in FIG. 7A, furthermore, the method for manufacturing the semiconductor apparatus according to the fourth embodiment includes, in the memory cell portion, the step of forming a contact hole on the second hard mask 56, forming a via hole electrode 22 in the contact hole, and furthermore, forming a wiring electrode 24 on the via hole electrode 22.

In addition, in the same manner as in FIG. 7A, the method for manufacturing the semiconductor apparatus according to the fourth embodiment includes, in the memory cell portion, the step of forming the plug electrode 12 on the diffusion layer 26 in the source-drain diffusion layers 26 and 28 of the memory cell transistor MT and forming the lower electrode 14 on the plug electrode 12.

In the same manner as in FIG. 7B, moreover, the method for manufacturing the semiconductor apparatus according to the fourth embodiment includes, in the peripheral circuit portion, the step of forming the contact diffusion layer 34 in the semiconductor substrate 10, forming a plug electrode 36 on the contact diffusion layer 34, forming the via hole electrode 38 on the plug electrode 36, and furthermore, forming the wiring electrode 40 on the via hole electrode 38.

With reference to the drawings, the manufacturing process will be described below in detail.

(a) First of all, as shown in FIG. 14, the first hard mask 55 and the second hard mask 56 are formed on the upper electrode 18, for example, and an etching technique such as RIE is used to process the second hard mask 56 and a part of the first hard mask 55.

As a material of the first hard mask 55, for example, an aluminum oxide film ($Al_xO_y$) can be used. As a material of the second hard mask 56, for example, an oxide film ($SiO_2$) can be used.

In case of the structure of the semiconductor apparatus according to the fourth embodiment, an aluminum oxide film ($Al_xO_y$) is used as the first hard mask 55. Consequently, it is possible to suppress a damage when depositing an $Al_2O_3$ film as the first sidewall mask 54 by an ALD method. Thus, it is possible to obtain a more excellent capacitor characteristic.

In the case in which an alumina film ($Al_2O_3$) is formed as the first hard mask 55, a sputtering method having a lower damage is used for suppressing a damage caused over a ferroelectric capacitor, for example. In the case in which the oxide film ($SiO_2$) is used as the second hard mask 56, moreover, a plasma CVD method is used.

More specifically, the following steps are used. First of all, a photoresist film is used to process the second hard mask 56 portion constituted by the oxide film ($SiO_2$) and a part of the first hard mask 55 constituted by the alumina film ($Al_2O_3$), and the photoresist film is removed by ashing.

The reason why the alumina film ($Al_2O_3$) is used as the first hard mask 55 is that a damage can be prevented from being caused over the ferroelectric capacitor by the presence of the alumina film ($Al_2O_3$) when depositing the oxide film ($SiO_2$) as the second hard mask 56 by a plasma CVD method and the alumina film ($Al_2O_3$) to be the first hard mask 55 has a high etching-selectivity for Ir or $IrO_2$ to be the material of the lower electrode 14.

For a multilayer hard mask material constituted by the first hard mask 55 and the second hard mask 56, moreover, it is also possible to use at least one of a zirconium oxide film ($ZrO_x$), a titanium oxide film ($TiO_x$), a titanium aluminum nitride film ($TiAl_xN_y$), a titanium nitride film ($Ti_xN_y$), a titanium aluminum nitride oxide film (TiAl$_X$N$_Y$O$_Z$) and a titanium nitride oxide film (Ti$_X$N$_Y$O$_Z$ film) in addition to the silicon oxide film (SiO$_2$) and the aluminum oxide film (Al$_X$O$_Y$).

(b) As shown in FIG. 14, next, the first sidewall mask 54 is deposited over a whole surface.

For example, in contrast to a thickness L1 of the second hard mask 56 and the processed part of the first hard mask 55, a thickness L5 of the first sidewall mask 54 deposited in the sidewall portion of the second hard mask 56 is equal to or smaller than (⅓)×L1. In the example of FIG. 14, an aspect ratio of the second hard mask 56 with the first sidewall mask 54 formed on the sidewall portion thereof can be set to be low.

For a material of the first sidewall mask 54, it is preferable to use a material having a higher etching-selectivity than the second hard mask 56.

As the material of the first side wall mask 54, for example, it is possible to use at least one of an oxide film (SiO$_2$), an aluminum oxide film (Al$_X$O$_Y$), a zirconium oxide film (ZrO$_X$), a titanium oxide film (TiO$_X$), a titanium aluminum nitride film (TiAl$_X$N$_Y$), a titanium nitride film (Ti$_X$N$_Y$), a titanium aluminum nitride oxide film (TiAl$_X$N$_Y$O$_Z$) and a titanium nitride oxide film (Ti$_X$N$_Y$O$_Z$).

As a method for depositing the first sidewall mask 54, for example, it is possible to use an ALD method. In the case in which an aluminum oxide film (Al$_2$O$_3$) is used as the first sidewall mask 54, for example, a deposited film has a thickness of approximately 20 nm.

The ALD method itself is a CVD method and it is impossible to disregard a damage over the ferroelectric capacitor in the deposition in order to use an organic metal material containing a hydrogen group. In order to suppress the damage, therefore, a sputtering method containing no hydrogen group during a film formation is used at the step of forming the first hard mask 55 constituted by the Al$_2$O$_3$ film in the multilayer mask (Al$_2$O$_3$/SiO$_2$) formed by the first hard mask 55 and the second hard mask 56.

(c) As shown in FIG. 15, next, a whole surface is etched back to remove the first sidewall mask 54 in a flat portion of the second hard mask 56 and that of the first hard mask 55, and the first sidewall mask 54 is left on only the sidewall of the second hard mask 56 and a part of the sidewall of the first hard mask 55.

(d) As shown in FIG. 15, furthermore, the residual portion of the first hard mask 55, the upper electrode 18, the ferroelectric film 16 and the lower electrode 14 are subjected to a collective processing to form the ferroelectric capacitor C$_{FE}$ by using the second hard mask 56 and the first sidewall mask 54 through an etching technique such as RIE.

In the example of FIG. 15, the second hard mask 56 is left in a predetermined thickness. Depending on etching conditions, however, the thickness of the second hard mask 56 is further reduced or the second hard mask 56 is completely etched and removed in some cases.

In addition, in the example of FIG. 15, the ferroelectric capacitor C$_{FE}$ portion is formed in a taper angle of 90 degrees. However, the taper angle of the ferroelectric capacitor C$_{FE}$ portion is not restricted to 90 degrees but is 70 to 89 degrees depending on conditions in the etching in some cases, for example.

A gas system for etching the ferroelectric capacitor material is as follows. As an etching gas for the lower electrode 14 formed of SrRuO$_3$, Pt, IrO$_2$, Ir or Ti, a chlorine-argon based gas is used, for example. As an etching gas for the ferroelectric film 16 formed of PZT (Pb(Zr$_X$Ti$_{1-X}$)O$_3$), for example, the chlorine-argon based gas is used. Referring to the upper electrode 18 formed of SrRuO$_3$ or IrO$_2$, similarly, the chlorine-argon based gas is used as an etching gas, for example.

According to the semiconductor apparatus and the method for manufacturing the semiconductor apparatus in accordance with the fourth embodiment, in the case in which the collective processing is performed by using the sidewall mask structure, the shoulder drop is not generated even if the first hard mask 55 and the second hard mask 56 which have small thicknesses are used. Thus, the ferroelectric capacitor structure can easily be made minuter.

According to the semiconductor apparatus and the method for manufacturing the semiconductor apparatus in accordance with the fourth embodiment, in the same manner as in the first to third embodiments, the thicknesses of the first hard mask 55 and the second hard mask 56 can be reduced as shown in FIGS. 7A and 7B. As a result, a thickness L3 of the via hole electrode 22 for forming a contact of the memory cell portion can be reduced, and a thickness L4 of the via hole electrode 38 for forming a contact in the peripheral circuit portion can be reduced and an aspect ratio of a via hole contact portion can be thus reduced. Consequently, a manufacturing yield can also be enhanced.

According to the semiconductor apparatus and the method for manufacturing the semiconductor apparatus in accordance with the fourth embodiment, in the same manner as in the first to third embodiments, it is possible to form a minute FeRAM capacitor having a capacitor structure with a great taper angle by using the thinned hard mask.

According to the semiconductor apparatus and the method for manufacturing the semiconductor apparatus in accordance with the fourth embodiment, in the same manner as in the first to third embodiments, the sidewall mask is formed on the sidewall of the hard mask by a material having a high etching-selectivity for the ferroelectric capacitor material, and the sidewall mask is used to process and form the ferroelectric capacitor. Consequently, it is possible to decrease an area of the ferroelectric capacitor and to reduce an aspect ratio of a contact around the ferroelectric capacitor. By a reduction in a memory cell size and an enhancement in a reliability, thus, a cost can be reduced.

According to the semiconductor apparatus and the method for manufacturing the semiconductor apparatus in accordance with the fourth embodiment, in the same manner as in the first and second embodiments, it is possible to reduce the thickness of the hard mask. Therefore, it is possible to form a minute 1-Mask-FeRAM capacitor structure.

Fifth Embodiment

Figure 18:
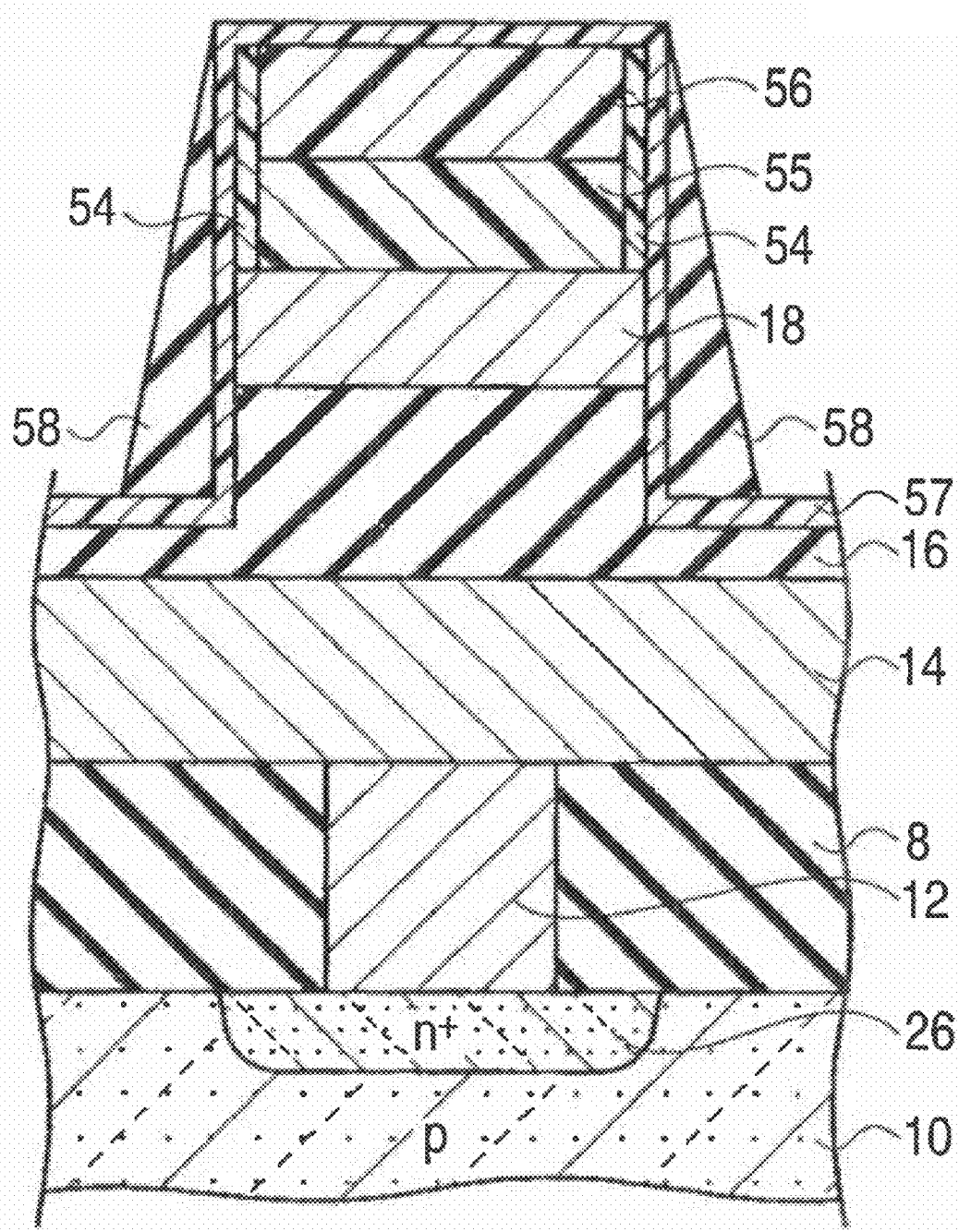
FIG. 18 is a typical sectional view showing a structure in one of steps of the method for manufacturing a semiconductor apparatus according to the fifth embodiment.
Figure 19:
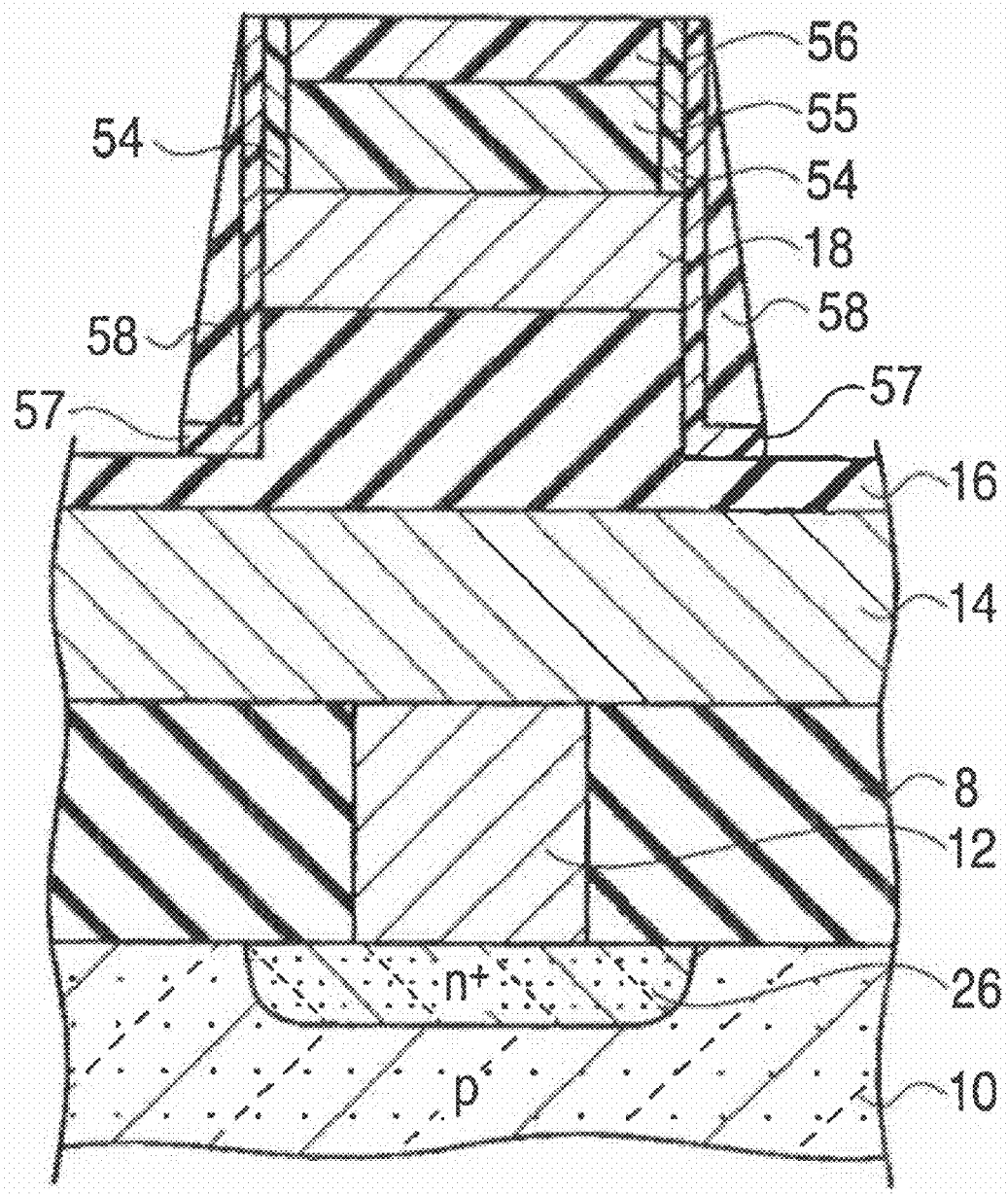
FIG. 19 is a typical sectional view showing a structure in one of steps of the method for manufacturing a semiconductor apparatus according to the fifth embodiment.
Figure 20:
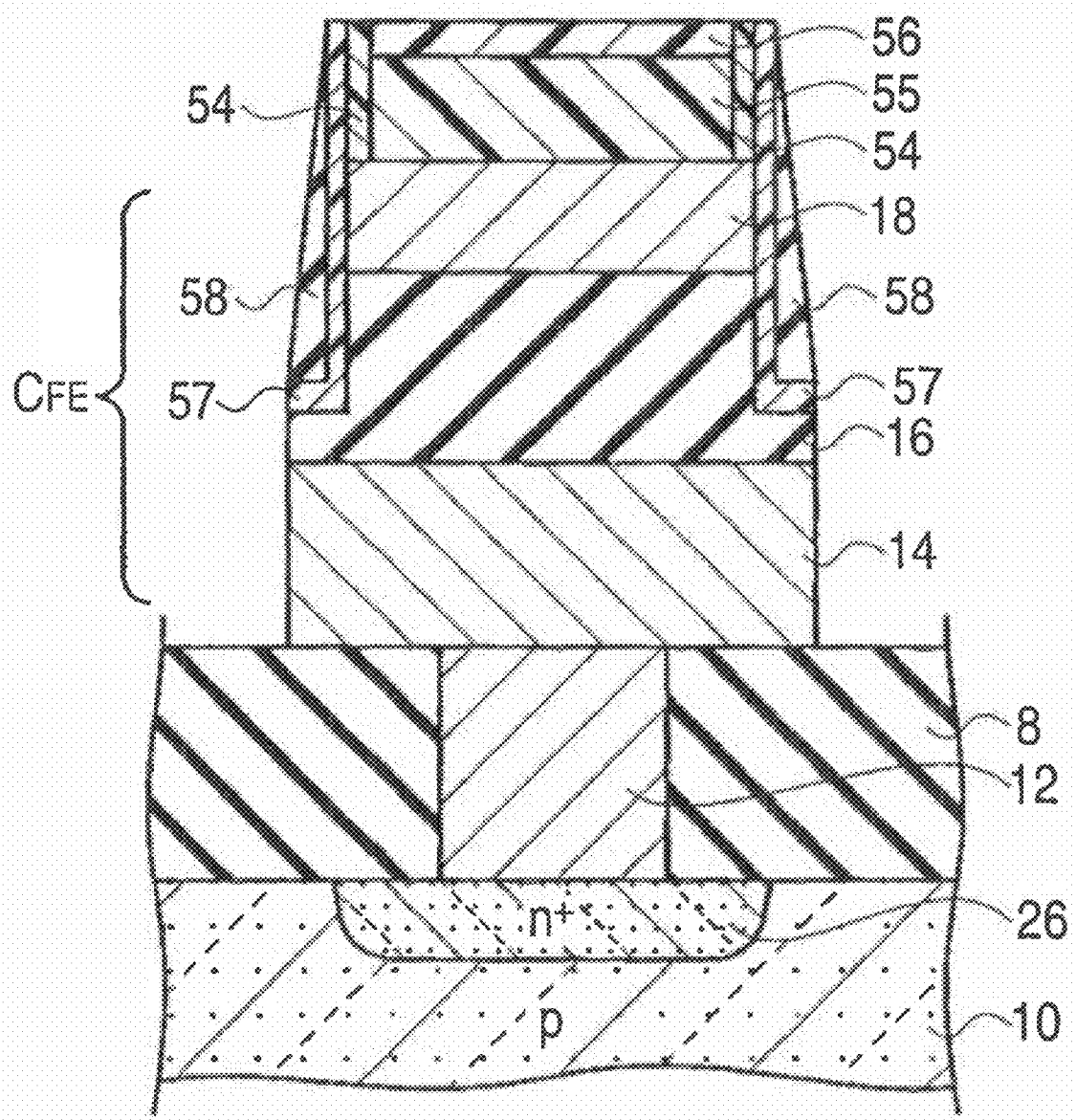
FIG. 20 is a typical sectional view showing a structure in one of steps of the method for manufacturing a semiconductor apparatus according to the fifth embodiment.

A typical sectional structure of steps in a method for manufacturing a semiconductor apparatus according to a fifth embodiment is shown in FIGS. 16 to 20. Moreover, FIG. 20 shows a typical sectional structure of a memory cell portion in the semiconductor apparatus according to the fifth embodiment.

(Device Structure)

As shown in FIG. 20, the semiconductor apparatus according to the fifth embodiment includes, in a memory cell portion, an interlayer insulating film 8 disposed on a semiconductor substrate 10, a ferroelectric capacitor C$_{FE}$ having a lower electrode 14 disposed on the interlayer insulating film 8, a ferroelectric film 16 disposed on the lower electrode 14, and an upper electrode 18 disposed on the ferroelectric film 16, a first hard mask 55 disposed on the upper electrode 18, a second hard mask 56 disposed on the first hard mask 55, a first sidewall mask 54 disposed on a sidewall of the second hard mask 56 and that of the first hard mask 55, and a second sidewall mask 57 disposed on a sidewall of the upper electrode 18 and a part of a sidewall of the ferroelectric film 16. The first hard mask 55, the second hard mask 56 and the first sidewall mask 54 are functioning as an upper mask.

In the semiconductor apparatus according to the fifth embodiment, the second sidewall mask 57 may be disposed on the sidewall of the second hard mask 56 and that of the first hard mask 55 through the first sidewall mask 54 in the memory cell portion as shown in FIG. 20.

In the semiconductor apparatus according to the fifth embodiment, furthermore, a third sidewall mask 58 may be disposed on the sidewall of the second hard mask 56 and that of the first hard mask 55, the sidewall of the upper electrode 18 and a part of the sidewall of the ferroelectric film 16 through the second sidewall mask 57 in the memory cell portion as shown in FIG. 20.

In the same manner as the semiconductor apparatus according to the first embodiment shown in FIG. 7A, the semiconductor apparatus according to the fifth embodiment includes, in the memory cell portion, a memory cell transistor MT having source-drain diffusion layers 26 and 28 disposed in the semiconductor substrate 10, a gate insulating film 32 disposed on the semiconductor substrate 10 between the source-drain diffusion layers 26 and 28, and a gate electrode 30 disposed on the gate insulating film 32.

In the same manner as in FIG. 7A, moreover, the semiconductor apparatus according to the fifth embodiment includes, in the memory cell portion, a plug electrode 12 disposed on the diffusion layer 26 in the source-drain diffusion layers 26 and 28 of the memory cell transistor MT, and the lower electrode 14 is connected to the plug electrode 12.

In the same manner as in FIG. 7B, furthermore, the semiconductor apparatus according to the fifth embodiment includes, in a peripheral circuit portion, a contact diffusion layer 34 disposed in the semiconductor substrate 10, the interlayer insulating film 8 disposed on the semiconductor substrate 10 in which the memory cell transistor MT is formed, a via hole electrode 38 disposed on the interlayer insulating film 8, and a wiring electrode 40 disposed on the via hole electrode 38.

In the semiconductor apparatus according to the fifth embodiment, as shown in FIG. 20, the lower electrode 14 of the ferroelectric capacitor $C_{FE}$ is connected to the source-drain diffusion layer 26 of the memory cell transistor MT. Therefore, the semiconductor apparatus according to the first embodiment can be applied to a TC unit series connection type FeRAM structure shown in FIGS. 21 and 22 or a 1T1C type FeRAM structure shown in FIG. 23 which will be described below, for example.

(Manufacturing Method)

As shown in FIGS. 16 to 20, the method for manufacturing the semiconductor apparatus according to the fifth embodiment includes, in the memory cell portion, the steps of forming the interlayer insulating film 8 on the semiconductor substrate 10, and forming the ferroelectric capacitor $C_{FE}$ having the lower electrode 14 disposed on the interlayer insulating film 8, the ferroelectric film 16 disposed on the lower electrode 14 and the upper electrode 18 disposed on the ferroelectric film 16. Moreover, the method includes the steps of forming the first hard mask 55 on the upper electrode 18 and forming the second hard mask 56 on the first hard mask 55. Furthermore, the method includes the steps of forming the first sidewall mask 54 on the sidewall of the second hard mask 56 and that of the first hard mask 55 and forming the second sidewall mask 57 on the sidewall of the upper electrode 18 and a part of the sidewall of the ferroelectric film 16.

The upper electrode 18 and a part of the ferroelectric film 16 are processed by using the second hard mask 56 and the first sidewall mask 54, and the partial remaining ferroelectric film 16 and the lower electrode 14 are processed by using the second hard mask 56 and the second sidewall mask 57.

Figure 17:
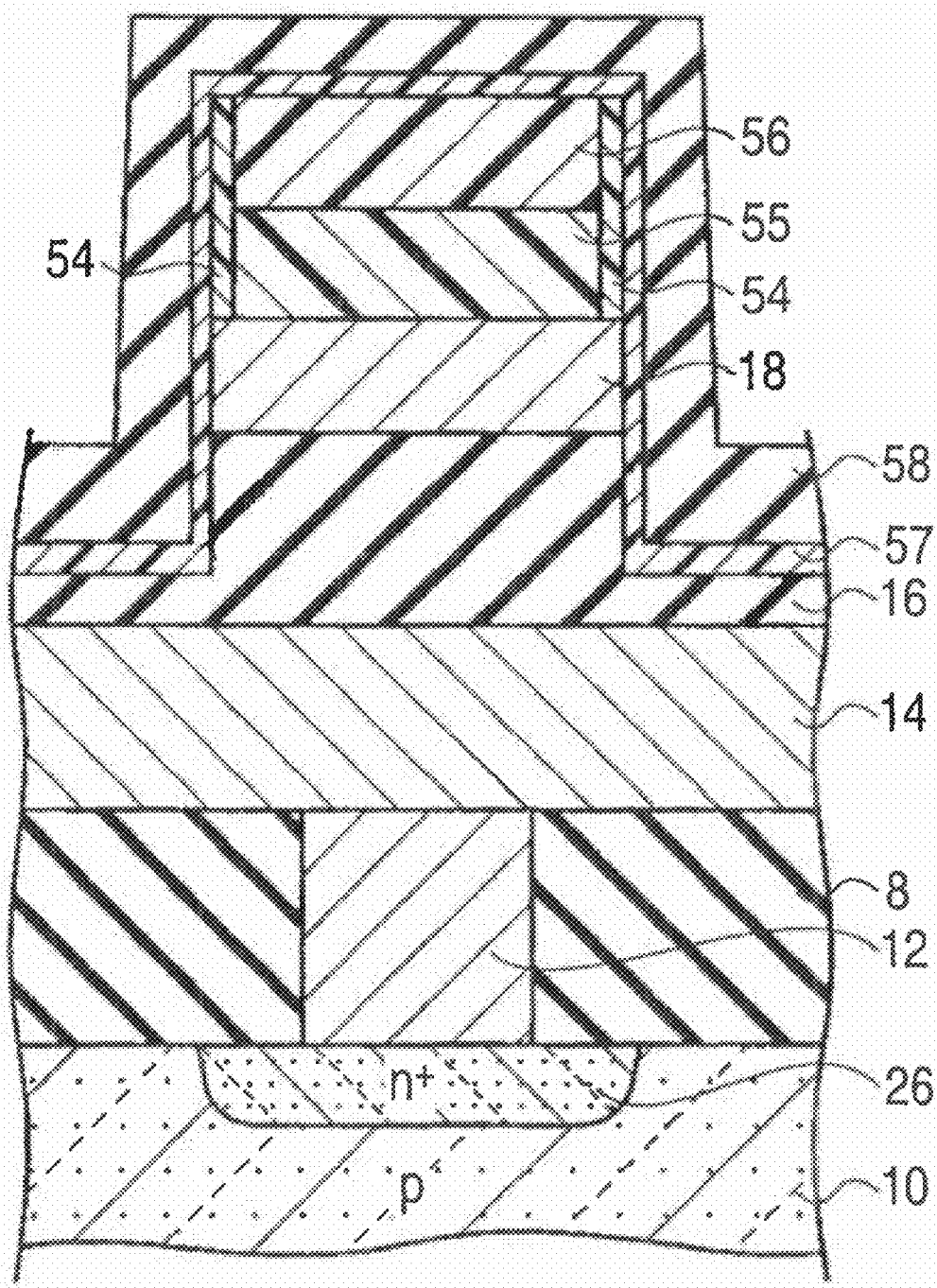
FIG. 17 is a typical sectional view showing a structure in one of steps of the method for manufacturing a semiconductor apparatus according to the fifth embodiment.

Furthermore, the method for manufacturing a semiconductor apparatus according to the fifth embodiment may include the step of forming the third sidewall mask 58 over a whole surface after forming the second sidewall mask 57 as shown in FIG. 17.

Moreover, the method for manufacturing a semiconductor apparatus according to the fifth embodiment may include the step of etching back the third sidewall mask 58 to remove the third sidewall mask 58 on a flat portion of the second sidewall mask 57, thereby leaving the third sidewall mask 58 on the sidewall of the second hard mask 56 and that of the first hard mask 55, the sidewall of the upper electrode 18 and a part of the sidewall of the ferroelectric film 16 as shown in FIG. 18.

Furthermore, the method for manufacturing a semiconductor apparatus according to the fifth embodiment may include the step of etching back the second sidewall mask 57 to remove the second sidewall mask 57 on a flat portion of the second hard mask 56 and that of the ferroelectric film 16, thereby exposing each of the flat portions of the second hard mask 56 and the ferroelectric film 16 and leaving the third sidewall mask 58 on the sidewall of the second hard mask 56 and that of the first hard mask 55, the sidewall of the upper electrode 18 and a part of the sidewall of the ferroelectric film 16 as shown in FIG. 19.

In addition, the method for manufacturing a semiconductor apparatus according to the fifth embodiment may include the step of performing a collective processing over the partial remaining ferroelectric film 16 and the lower electrode 14 by using the second hard mask 56, the first sidewall mask 54, the second sidewall mask 57 and the third sidewall mask 58 as shown in FIG. 20.

In the same manner as in FIG. 7A, moreover, the method for manufacturing the semiconductor apparatus according to the fifth embodiment includes, in the memory cell portion, the step of forming the memory cell transistor MT having the source-drain diffusion layers 26 and 28 disposed in the semiconductor substrate 10, the gate insulating film 32 disposed on the semiconductor substrate 10 between the source-drain diffusion layers 26 and 28, and the gate electrode 30 disposed on the gate insulating film 32.

In the same manner as in FIG. 7A, furthermore, the method for manufacturing a semiconductor apparatus according to the fifth embodiment includes, in the memory cell portion, the step of forming a contact hole on the second hard mask 56, forming a via hole electrode 22 in the contact hole, and furthermore, forming a wiring electrode 24 on the via hole electrode 22.

In addition, in the same manner as in FIG. 7A, the method for manufacturing the semiconductor apparatus according to the fifth embodiment includes, in the memory cell portion, the step of forming the plug electrode 12 on the diffusion layer 26 in the source-drain diffusion layers 26 and 28 of the memory cell transistor MT and forming the lower electrode 14 on the plug electrode 12.

In the same manner as in FIG. 7B, moreover, the method for manufacturing the semiconductor apparatus according to the fifth embodiment includes, in the peripheral circuit portion, the step of forming the contact diffusion layer 34 in the semiconductor substrate 10, forming a plug electrode 36 on the contact diffusion layer 34, forming the via hole electrode 38 on the plug electrode 36, and furthermore, forming the wiring electrode 40 on the via hole electrode 38.

With reference to the drawings, the manufacturing process will be described below in detail.

Figure 16:
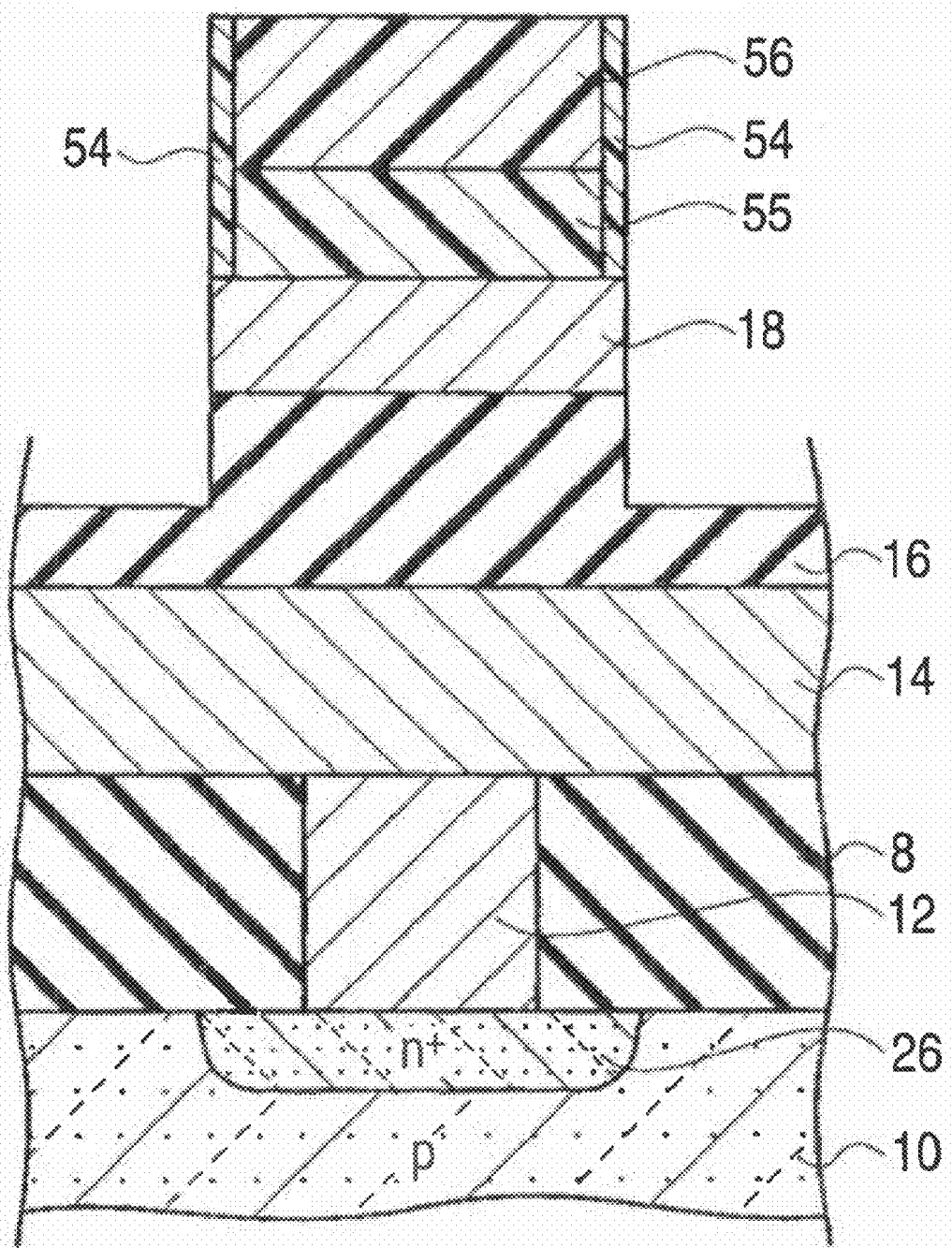
FIG. 16 is a typical sectional view showing a structure in one of steps of a method for manufacturing a semiconductor apparatus according to a fifth embodiment.

First of all, as shown in FIG. 16, steps before a hard mask structure is formed and a processing is performed up to the middle of the upper electrode 18 and the ferroelectric film 16 in the same manner as in the method for manufacturing a semiconductor apparatus disclosed in each of the first to fourth embodiments will be described.

(a) For example, the first hard mask 55 and the second hard mask 56 are formed on the upper electrode 18, for example, and an etching technique such as RIE is used to process the first hard mask 55 and the second hard mask 56.

As a material of the first hard mask 55, for example, an aluminum oxide film ($Al_xO_Y$) can be used. As a material of the second hard mask 56, for example, an oxide film ($SiO_2$) can be used.

In the case in which an alumina film ($Al_2O_3$) is used as the first hard mask 55, a sputtering method having a lower damage is used for suppressing a damage caused over a ferroelectric capacitor. In the case in which the oxide film ($SiO_2$) is used as the second hard mask 56, moreover, a plasma CVD method is used.

More specifically, the following steps are used. First of all, a photoresist film is used to process the oxide film ($SiO_2$) portion as the second hard mask 56, and the photoresist film is removed by ashing and the first hard mask 55 constituted by the alumina film ($Al_2O_3$) is processed by the RIE using the second hard mask 56 itself which is constituted by the oxide film ($SiO_2$).

The reason why the alumina film ($Al_2O_3$) is used as the first hard mask 55 is that a damage can be prevented from being caused over the ferroelectric capacitor when depositing the oxide film ($SiO_2$) as the second hard mask 56 by the plasma CVD method and the alumina film ($Al_2O_3$) to be the first hard mask 55 has a high etching-selectivity for Ir or $IrO_2$ to be the material of the lower electrode 14.

For a multilayer hard mask material constituted by the first hard mask 55 and the second hard mask 56, moreover, it is also possible to use at least one of a zirconium oxide film ($ZrO_X$), a titanium oxide film ($TiO_X$), a titanium aluminum nitride film ($TiAl_xN_Y$), a titanium nitride film ($Ti_xN_Y$), a titanium aluminum nitride oxide film ($TiAl_xN_YO_Z$) and a titanium nitride oxide film ($Ti_xN_YO_Z$ film) in addition to the silicon oxide film ($SiO_2$) and the aluminum oxide film ($Al_xO_Y$).

(b) Furthermore, the first sidewall mask 54 is deposited over a whole surface.

For a material of the first sidewall mask 54, it is preferable to use a material having a higher etching-selectivity than the second hard mask 56.

As the material of the first side wall mask 54, for example, it is possible to use at least one of an oxide film ($SiO_2$), an aluminum oxide film ($Al_xO_Y$), a zirconium oxide film ($ZrO_X$), a titanium oxide film ($TiO_X$), a titanium aluminum nitride film ($TiAl_xN_Y$), a titanium nitride film ($Ti_xN_Y$), a titanium aluminum nitride oxide film ($TiAl_xN_YO_Z$) and a titanium nitride oxide film ($Ti_xN_YO_Z$).

As a method for depositing the first sidewall mask 54, for example, it is possible to use an ALD method. In the case in which an aluminum oxide film ($Al_2O_3$) is used, a deposited film has a thickness of approximately 20 nm.

(c) Furthermore, a whole surface is etched back to leave the first sidewall mask 54 in only the sidewall portions of the first hard mask 55 and the second hard mask 56.

(d) As shown in FIG. 16, furthermore, the upper electrode 18 and a part of the ferroelectric film 16 are processed with the second hard mask 56 and the first sidewall mask 54 by using an etching technique such as RIE.

As a gas system for etching the ferroelectric capacitor material, a chlorine-argon based gas is used for the upper electrode 18 formed of $SrRuO_3$ or $IrO_2$, for example. Referring to an etching gas for the ferroelectric film 16 formed of PZT ($Pb(Zr_xTi_{1-x})O_3$), furthermore, the chlorine-argon based gas is also used, for example.

(e) Next, as shown in FIG. 17, the second sidewall mask 57 and the third sidewall mask 58 are deposited over a whole surface.

As a method for depositing the second sidewall mask 57, for example, it is possible to use the ALD method. In the case in which an aluminum oxide film ($Al_2O_3$) is used, a deposited film has a thickness of approximately 40 nm.

As a method for depositing the third sidewall mask 58, for example, it is possible to use the plasma CVD method. In the case in which an oxide film ($SiO_2$) is used, a deposited film has a thickness of approximately 50 nm.

For materials of the second and third sidewall masks, it is preferable to use a material having a higher etching-selectivity than the second hard mask 56. As the materials of the second and third sidewall masks, for example, it is possible to use at least one of an oxide film ($SiO_2$), an aluminum oxide film ($Al_xO_Y$), a zirconium oxide film ($ZrO_X$), a titanium oxide film ($TiO_X$), a titanium aluminum nitride film ($TiAl_xN_Y$), a titanium nitride film ($Ti_xN_Y$), a titanium aluminum nitride oxide film ($TiAl_xN_YO_Z$) and a titanium nitride oxide film ($Ti_xN_YO_Z$).

(f) As shown in FIG. 18, next, the third sidewall mask 58 excluding the sidewall portion is removed by an etching-back.

(g) As shown in FIG. 19, then, the second sidewall mask 57 excluding the sidewall portion is removed by the etching-back. As a result, as shown in FIG. 19, the second sidewall mask 57 formed by the $Al_2O_3$ film and the third sidewall mask 58 formed by the $SiO_2$ film are provided in the sidewall portion of the ferroelectric capacitor, for example.

(h) As shown in FIG. 20, thereafter, the residual ferroelectric film 16 and the lower electrode 14 are processed to form the ferroelectric capacitor $C_{FE}$ by using the first hard mask 55/the second hard mask 56 which are constituted by $Al_2O_3$/$SiO_2$, the first sidewall mask 54 constituted by $Al_2O_3$, and the second sidewall mask 57/the third sidewall mask 58 which are constituted by the $Al_2O_3$ film/the $SiO_2$ film.

As a gas system for etching the ferroelectric capacitor material, a chlorine-argon based gas is used for an etching gas of the lower electrode 14 formed of $SrRuO_3$, Pt, $IrO_2$, Ir or Ti, for example.

With the structure of the semiconductor apparatus according to the fifth embodiment, a collective processing is not performed but the sidewall mask is applied when the ferroelectric capacitor material is to be processed in two steps.

The semiconductor apparatus according to the fifth embodiment has a structural feature that a capacitor leakage of the ferroelectric capacitor $C_{FE}$ can be reduced more greatly and a polarization amount characteristic can also be improved more highly than those in the semiconductor apparatuses according to the first to fourth embodiments because the sidewall portion of the upper electrode 18 and a part of the sidewall of the ferroelectric film 16 are covered with the second sidewall mask 57 before a residual part of the ferroelectric film 16 and the lower electrode 14 are etched.

In contrast to a ferroelectric capacitor structure formed by a conventional 2-Mask-2-PEP method, moreover, a 2-Mask- 1-PEP structure is employed. Therefore, the number of PEPs can be reduced and a size of the ferroelectric capacitor can be decreased.

According to the semiconductor apparatus and the method for manufacturing the semiconductor apparatus in accordance with the fifth embodiment, in the case in which the processing is performed by using the sidewall mask structure, a processing can be performed without generating the shoulder drop and a minuteness can easily be increased even if the first hard mask 55 and the second hard mask 56 which have small thicknesses are used.

According to the semiconductor apparatus and the method for manufacturing the semiconductor apparatus in accordance with the fifth embodiment, as shown in FIGS. 7A and 7B, the thicknesses of the first hard mark 55 and the second hard mask 56 can be reduced. As a result, a thickness L3 of the via hole electrode 22 for forming a contact of the memory cell portion can be reduced and a thickness L4 of the via hole electrode 38 for forming a contact of the peripheral circuit portion can be reduced, and an aspect ratio of the via hole contact portion can be reduced and a manufacturing yield can also be enhanced.

According to the semiconductor apparatus and the method for manufacturing the semiconductor apparatus in accordance with the fifth embodiment, it is possible to form a minute FeRAM capacitor having a capacitor structure with a high taper angle by using the hard mask having a thickness reduced.

According to the semiconductor apparatus and the method for manufacturing the semiconductor apparatus in accordance with the fifth embodiment, moreover, the sidewall mask is formed on the sidewall of the hard mask by a material having a higher etching-selectivity than the ferroelectric capacitor material, and the ferroelectric capacitor is processed and formed by using the sidewall mask. Consequently, it is possible to decrease an area of the ferroelectric capacitor and to reduce an aspect ratio of a contact around the ferroelectric capacitor. By a decrease in a memory cell size and an enhancement in a reliability, furthermore, it is possible to reduce a cost.

According to the semiconductor apparatus and the method for manufacturing the semiconductor apparatus in accordance with the fifth embodiment, it is possible to thin the hard mask. Therefore, it is possible to form a minute 2-Mask-1-PEP FeRAM capacitor structure.

(Memory Cell Array)

The semiconductor apparatuses according to the first to fifth embodiments can be applied to all semiconductors using the ferroelectric capacitor. For example, the semiconductor apparatuses according to the first to fifth embodiments are particularly applied to a TC unit series connection type FeRAM having a structure in which a plurality of memory cells obtained by connecting both electrodes of the ferroelectric capacitor is connected in series to a source-drain of an MOS transistor, a 1T1C type FeRAM having a structure in which the ferroelectric capacitor is connected in series to a source or a drain of an MOS transistor or a 1T type FeRAM in which a gate capacitor of an MOS transistor is constituted by a ferroelectric capacitor $C_{FE}$.

(TC Unit Series Connection Type FeRAM)

Figure 21:
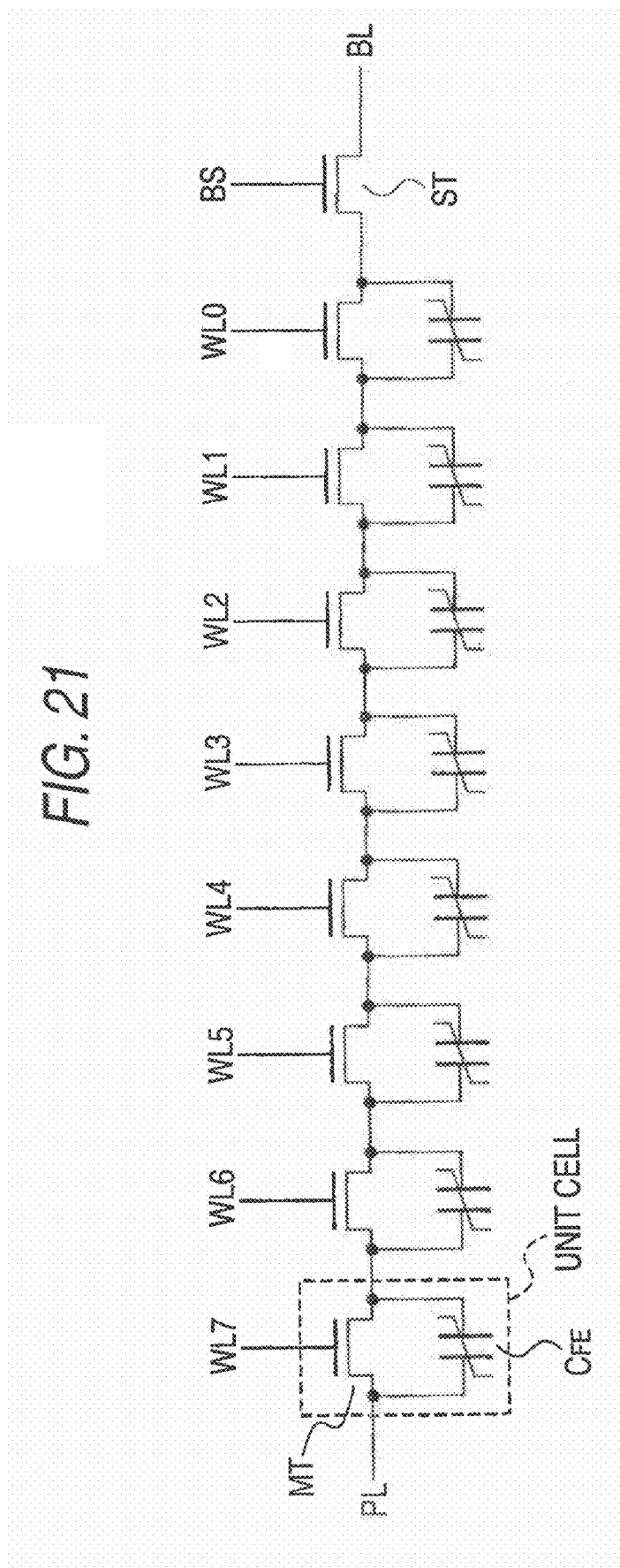
FIG. 21 is a circuit diagram showing a structure of a TC unit series connection type FeRAM cell block using the semiconductor apparatuses according to one of the first to fifth embodiments.

A circuit structure of a TC unit series connection type FeRAM cell block to which the semiconductor apparatuses according to the first to fifth embodiments can be applied is typically illustrated in FIG. 21. Since the TC unit series connection type FeRAM has a structure in which a unit cell obtained by connecting a memory cell transistor MT to a ferroelectric capacitor $C_{FE}$ in parallel is connected in series, it is also referred to as a chain FeRAM.

The unit cell of the TC unit series connection type FeRAM has a structure in which both ends of the ferroelectric capacitor $C_{FE}$ are connected between the source and the drain of the memory cell transistor MT respectively as shown in FIG. 21, for example. As shown in FIG. 21, a plurality of unit cells is disposed in series between a plate line PL and a bit line BL. A plurality of blocks of a TC unit series connection type FeRAM string which is thus connected in series is selected by a block selecting transistor ST. Word lines WL0, WL1, WL2, . . . , WL7 are connected to gates of the memory cell transistors MT respectively and a block selecting line BS is connected to a gate of the block selecting transistor ST.

Figure 22:
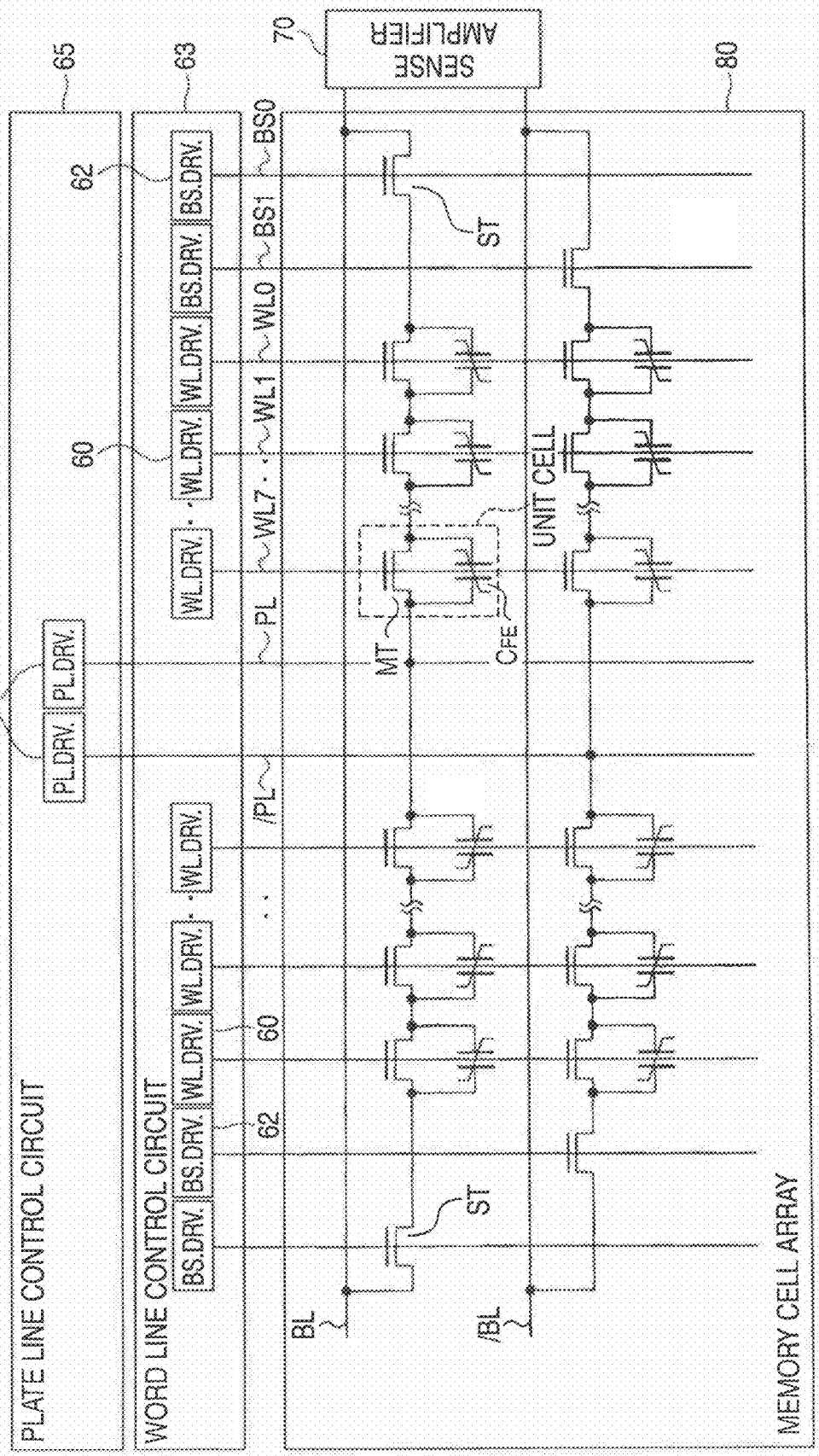
FIG. 22 is a typical block diagram showing a structure of a TC unit series connection type FeRAM cell array, illustrating an example of a memory cell array using the semiconductor apparatuses according to one of the first to fifth embodiments.

As an example of a memory cell array to which the semiconductor apparatuses according to the first to fifth embodiments can be applied, the block structure of a TC unit series connection type FeRAM cell array is typically illustrated in FIG. 22. As shown in FIG. 22, the TC unit series connection type FeRAM cell array includes a memory cell array 80, a word line control circuit 63 connected to the memory cell array 80, and a plate line control circuit 65 connected to the word line control circuit 63. In the memory cell array 80, a plurality of TC unit series connection type FeRAM cells is arranged in a matrix.

As shown in FIG. 22, the word lines WLs (WL0 to WL7) are connected to word line drivers (WL.DRV.) 60 disposed in the word line control circuit 63 respectively, and the block selecting lines BSs (BS0, BS1) are connected to block selecting line drivers (BS.DRV.) 62 disposed in the word line control circuit 63 respectively. On the other hand, the plate lines PLs (PL, /PL) are connected to plate line drivers (PL.DRV.) 64 disposed in the plate line control circuit 65, respectively.

As shown in FIG. 22, the memory cell array 80 has a structure in which the blocks of the TC unit series connection type FeRAM are disposed in parallel in a direction in which the word lines WLs (WL0 to WL7) are extended. Moreover, the memory cell array 80 has a structure in which the block of the TC unit series connection type FeRAM is folded back in a direction in which the bit line BL (BL, /BL) is extended around the plate line PL (PL, /PL) as shown in FIG. 22.

In the TC unit series connection type FeRAM, an electric potential V (WL) of the word line WL (WL0 to WL7) and an electric potential V (BS) of the block selecting line BS (BS0, BS1) take an internal source voltage VPP or a ground potential GND, for example, 0V. In a standby state, moreover, the electric potential V(WL) of the word line WL is equal to VPP (V) and the electric potential V(BS) of the block selecting line BS is equal to 0(V), for example. An electric potential V(PL) of the plate line PL (PL, /PL) takes an electric potential of an internal source voltage VINT or the ground potential GND. In the standby state, furthermore, the electric potential V(PL) of the plate line PL is equal to 0(V).

A sense amplifier 70 is connected to the bit line BL (BL, /BL). In the sense amplifier 70, a micro signal sent from the FeRAM unit cell is compared and amplified so that a signal defined to have a high level or a low level is read. In the standby state, an electric potential V(BL) of the bit line is equal to 0(V).

(1T1C Type FeRAM)

Figure 23:
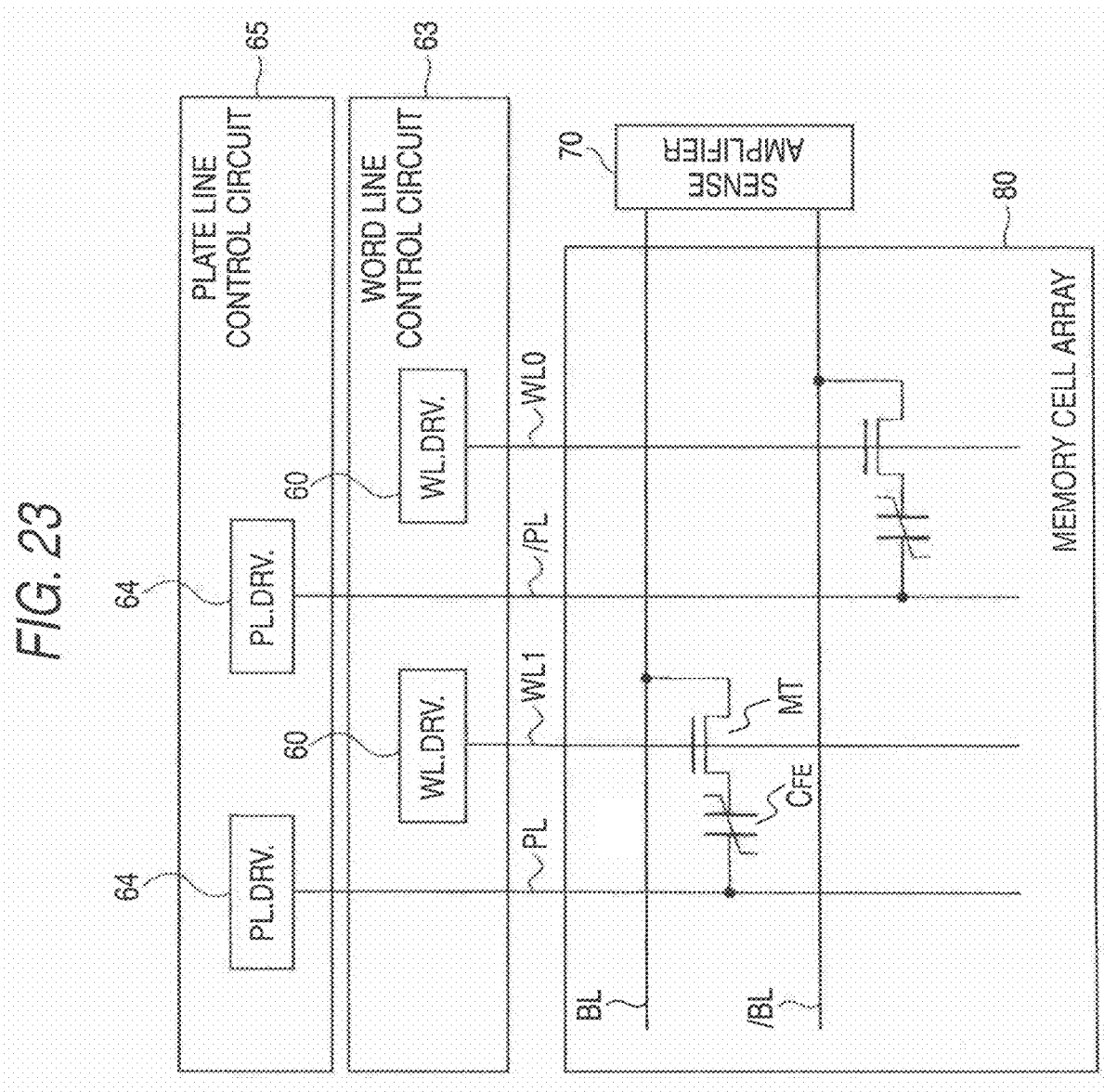
FIG. 23 is a typical block diagram showing a structure of a 1T1C type FeRAM cell array, illustrating an example of the memory cell array using the semiconductor apparatuses according to one of the first to fifth embodiments.

A typical circuit structure in a memory cell array of the 1T1C type FeRAM to which the semiconductor apparatuses according to the first to fifth embodiments can be applied is illustrated in FIG. 23.

As shown in FIG. 23, the 1T1C type FeRAM includes a memory cell array 80, a word line control circuit 63 connected to the memory cell array 80, and a plate line control circuit 65 connected to the word line control circuit 63. A plurality of 1T1C type FeRAM cells is integrated and disposed in a matrix in the memory cell array 80.

For example, a unit cell of the 1T1C type FeRAM has a structure in which a ferroelectric capacitor $C_{FE}$ is connected in series to a source of a memory cell transistor MT as shown in FIG. 23. Such a unit cell is disposed in a crossing portion of a plurality of plate lines PLs (PL, /PL) and a plurality of bit lines BLs (BL, /BL) to constitute a matrix as shown in FIG. 23.

A word line WL (WL0, WL1, ...) is connected to a gate of each memory cell transistor MT, the other electrode on an opposite side to an electrode of the ferroelectric capacitor $C_{FE}$ connected to a source of the memory cell transistor MT is connected to the plate line PL (PL, /PL) as shown in FIG. 23, and the bit line BL (BL, /BL) is connected to a drain of the memory cell transistor MT.

As shown in FIG. 23, the word lines WLs (WL0, WL1 ...) are connected to word line drivers (WL.DRV.) 60 disposed in the word line control circuit 63 respectively. On the other hand, the plate lines PLs (PL, /PL) are connected to plate line drivers (PL.DRV.) 64 disposed in the plate line control circuit 65, respectively.

In the 1T1C type FeRAM, an electric potential of the word line WL (WL0, WL1, ...) takes an internal power supply VPP or a ground potential GND, for example, 0V. In a standby state, moreover, V(WL)=VPP is set, for example. An electric potential of the plate line PL (PL, /PL) takes an internal power supply VINT or the ground potential GND. In the standby state, furthermore, V(PL)=0(V) is set. A sense amplifier 70 is connected to the bit line BL (BL, /BL). In the sense amplifier 70, a micro signal sent from the FeRAM is compared and amplified so that a signal defined to have a high level or a low level is read. In the standby state, V(BL)=0(V) is set.

(1 Transistor Type FeRAM)

Figure 24:
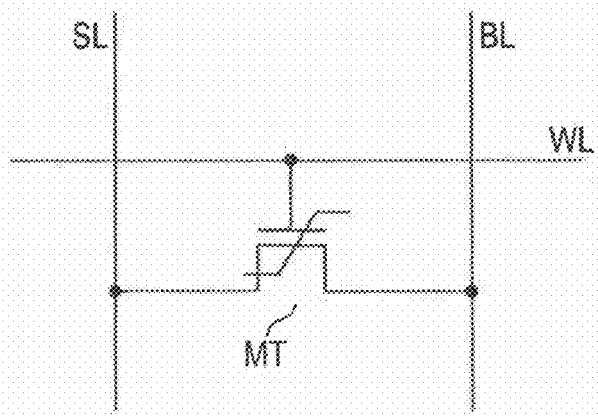
FIG. 24 is a typical circuit diagram showing a structure of a 1T type FeRAM cell, illustrating an example of the memory cell array using the semiconductor apparatuses according to one of the first to fifth embodiments.

A typical circuit structure of the 1T type FeRAM cell to which the semiconductor apparatuses according to the first to fifth embodiments can be applied is illustrated in FIG. 24.

More specifically, a source region is connected to a source line SL, a drain region is connected to a bit line BL, an MOS gate capacitor of an MOS transistor is formed by a ferroelectric capacitor $C_{FE}$, and a word line WL is connected to an MOS gate electrode. The structure of the 1T type FeRAM shown in FIG. 24 is arranged in a matrix to constitute a memory cell array.

OTHER EMBODIMENTS

While the invention has been described above based on the first to fifth embodiments, it is to be understood that the invention is not restricted to the statement and the drawings which constitute apart of the disclosure. From the disclosure, various alternative embodiments, examples and operating techniques are apparent to the skilled in the art.

Thus, it is a matter of course that the invention includes various embodiments which have not been described. Accordingly, the technical range of the invention is determined by only the specific matters of the invention related to claims which are proper from the description.

According to the semiconductor apparatus and the method for manufacturing the semiconductor apparatus in accordance with an aspect of the invention, it is possible to thin a hard mask. Consequently, it is possible to form a minute FeRAM capacitor structure.

What is claimed is:

1. A semiconductor apparatus comprising:
   a semiconductor substrate;
   a memory cell transistor comprising:
   a source diffusion layer disposed on the semiconductor substrate,
   a drain diffusion layer disposed on the semiconductor substrate,
   a gate insulating film disposed on the semiconductor substrate between the source diffusion layer and the drain diffusion layer, and
   a gate electrode disposed on the gate insulating film;
   an interlayer insulating film disposed on the semiconductor substrate and on the memory cell transistor;
   a ferroelectric capacitor comprising:
   a lower electrode disposed on the interlayer insulating film,
   a ferroelectric film disposed on the lower electrode, and
   an upper electrode disposed on the ferroelectric film; and
   an upper mask comprising:
   a hard mask disposed on the upper electrode, and
   a sidewall mask disposed on at least part of a sidewall of the hard mask,
   wherein the whole sidewall mask is positioned above the ferroelectric capacitor.

2. The semiconductor apparatus according to claim 1, wherein the hard mask comprises:
   a first hard mask disposed on the upper electrode, and
   a second hard mask disposed on the first hard mask.

3. The semiconductor apparatus according to claim 2, wherein the sidewall mask covers:
   a sidewall of the first hard mask, and
   a sidewall of the second hard mask.

4. The semiconductor apparatus according to claim 2, wherein the sidewall mask covers:
   a sidewall of the second hard mask.

5. The semiconductor apparatus according to claim 2, wherein the sidewall mask covers:
   a part of a sidewall of the first hard mask, and
   a sidewall of the second hard mask.

6. The semiconductor apparatus according to claim 1, wherein an edge of the ferroelectric capacitor and an edge of the upper mask align to form a continuous sidewall.

7. The semiconductor apparatus according to claim 1 further comprising:
   a second sidewall mask that covers:
   a sidewall of the upper mask,
   a sidewall of the upper electrode, and
   a part of a sidewall of the ferroelectric film.

8. The semiconductor apparatus according to claim 7 further comprising:
   a third sidewall mask that covers:
   the second sidewall mask.

9. The semiconductor apparatus according to claim 1, wherein the hard mask comprises, at least one of, a silicon oxide, an aluminum oxide, a zirconium oxide, a titanium oxide, a titanium aluminum nitride, a titanium nitride, a titanium aluminum nitride oxide and a titanium nitride oxide.

10. The semiconductor apparatus according to claim 1, wherein the sidewall mask comprises, at least one of, a silicon oxide, an aluminum oxide, a zirconium oxide, a titanium oxide, a titanium aluminum nitride, a titanium nitride, a titanium aluminum nitride oxide and a titanium nitride oxide.

* * * * *